United States Patent
Tang et al.

(10) Patent No.: US 10,381,257 B2
(45) Date of Patent: Aug. 13, 2019

(54) SUBSTRATE CONVEYING ROBOT AND SUBSTRATE PROCESSING SYSTEM WITH PAIR OF BLADE MEMBERS ARRANGED IN POSITION OUT OF VERTICAL DIRECTION

(71) Applicants: KAWASAKI JUKOGYO KABUSHIKI KAISHA, Kobe-shi, Hyogo (JP); KAWASAKI ROBOTICS (USA), INC., Wixom, MI (US)

(72) Inventors: Mark Tang, Walnut Creek, CA (US); Eric Chan, San Francisco, CA (US); Shigeki Ono, Campbell, CA (US); Shinya Kitano, San Jose, CA (US); Ming Zeng, San Jose, CA (US); Hirohiko Goto, Akashi (JP)

(73) Assignees: KAWASAKI JUKOGYO KABUSHIKI KAISHA, Kobe-shi (JP); KAWASAKI ROBOTICS (USA), INC., Wixom, MI (US)

( * ) Notice: Subject to any disclaimer, the term of this patent is extended or adjusted under 35 U.S.C. 154(b) by 0 days.

(21) Appl. No.: 14/840,593

(22) Filed: Aug. 31, 2015

(65) Prior Publication Data
US 2017/0062264 A1  Mar. 2, 2017

(51) Int. Cl.
*B25J 9/04* (2006.01)
*H01L 21/687* (2006.01)
*H01L 21/677* (2006.01)

(52) U.S. Cl.
CPC ........ *H01L 21/68707* (2013.01); *B25J 9/042* (2013.01); *H01L 21/67742* (2013.01); *H01L 21/67766* (2013.01); *H01L 21/67778* (2013.01); *H01L 21/67781* (2013.01)

(58) Field of Classification Search
CPC .................................. B25J 9/042; B25J 9/043
See application file for complete search history.

(56) References Cited

U.S. PATENT DOCUMENTS

| | | | | |
|---|---|---|---|---|
| 5,989,346 A | * | 11/1999 | Hiroki | C23C 14/566 118/719 |
| 7,699,021 B2 | * | 4/2010 | Volfovski | G03B 27/32 118/50 |
| 8,277,163 B2 | * | 10/2012 | Murata | H01L 21/67742 414/282 |
| 2007/0274811 A1 | * | 11/2007 | Murata | H01L 21/67742 414/217 |
| 2013/0028687 A1 | | 1/2013 | Takahashi et al. | |

(Continued)

FOREIGN PATENT DOCUMENTS

| | | | | |
|---|---|---|---|---|
| JP | 06336308 A | * | 12/1994 | .......... G03F 7/7075 |
| JP | 07050334 A | * | 2/1995 | |

(Continued)

*Primary Examiner* — Gerald McClain
(74) *Attorney, Agent, or Firm* — Oliff PLC

(57) ABSTRACT

A control unit of a substrate conveying robot makes a robot arm and a substrate holding device execute a blade member advancing operation, a substrate receiving operation, and a substrate placing operation. The substrate holding device is configured to be capable of being switched between a first working state that a pair of blade members are arranged in the vertical direction and a second working state that a pair of blade members are arranged in a position out of the vertical direction and a single blade member can be advanced into a substrate placing structure.

26 Claims, 34 Drawing Sheets

(56) References Cited

U.S. PATENT DOCUMENTS

| | | | | |
|---|---|---|---|---|
| 2015/0016935 A1* | 1/2015 | Hashimoto | ....... | H01L 21/67742 414/744.5 |
| 2015/0016936 A1* | 1/2015 | Shindo | .................... | H01L 21/68 414/749.5 |
| 2015/0268660 A1* | 9/2015 | Hirato | ............... | H01L 21/67745 700/112 |
| 2017/0062264 A1 | 3/2017 | Tang et al. | | |

FOREIGN PATENT DOCUMENTS

| | | | |
|---|---|---|---|
| JP | 07297255 A | * | 11/1995 |
| JP | H07-297255 A | | 11/1995 |
| JP | H11-330189 A | | 11/1999 |
| JP | 2004-311821 A | | 11/2004 |
| JP | 2004311821 A | * | 11/2004 |
| JP | 2013-030701 A | | 2/2013 |
| JP | 2013-163231 A | | 8/2013 |
| JP | 2014-132684 A | | 7/2014 |
| WO | 2017/038811 A1 | | 3/2017 |

* cited by examiner

SUBSTRATE CONVEYING ROBOT AND SUBSTRATE PROCESSING SYSTEM WITH PAIR OF BLADE MEMBERS ARRANGED IN POSITION OUT OF VERTICAL DIRECTION

TECHNICAL FIELD

The present invention relates to a substrate conveying robot having a robot arm on which a substrate holding device is mounted and to a substrate processing system provided with the substrate conveying robot.

BACKGROUND ART

Conventionally, a technology of conveying substrates such as wafers for manufacturing semiconductors by a robot is used broadly. Here, various processing steps such as a wafer cleaning process, a film-forming process, a heating process, and an etching process are executed when manufacturing semiconductors. The respective processing steps are executed by different processing devices respectively, and therefore wafers need to be conveyed among a plurality of processing devices.

A robot is used for the above-stated wafer conveyance and high cleanliness is required for the surrounding atmosphere in the semiconductor manufacturing process. Therefore, the benefit of an unmanned operation by using a robot is great.

Also, shortening the tact time in conveying wafers is required in order to improve throughput of the semiconductor manufacture. There is a robot conveying a plurality of wafers at the same time by one hand mounted on a robot arm as a technology for shortening the tact time in conveying wafers. A robot of this type holds and takes a plurality of wafers at the same time by one hand from a lot of wafers stored in a FOUP and conveys them to a wafer placing shelf on the processing device side at the same time, for example (Patent Document 1).

Note that there are a process of treating a plurality of wafers at the same time (batch processing step) and a process of treating wafers one by one (single-wafer processing step) in various processing steps in manufacturing semiconductors. When conveying wafers in relation to the batch processing step, the above-stated robot which conveys a plurality of wafers at the same time is suitable.

On the other hand, as the processing step is executed for each wafer when conveying wafers in relation to the single-wafer processing step, conveying processed wafers and un-processed wafers one by one respectively is sometimes advantageous. In this case, the above-stated robot of a system conveying a plurality of wafers at the same time is not suitable.

In Patent Document 2, a substrate holding device including a pair of hands (U-shaped blade members) capable of sagging their interval in the vertical direction is described as a technology of carrying-out one processed substrate and carrying-in one unprocessed substrate at the same time. In this substrate holding device, when a lower hand is in a wafer holding state and an upper hand is in a wafer non-holding state, a vertical interval between the hands is widened. Thereby a wafer held by the lower hand is placed on a lower empty stage of a shelf and the empty upper hand can receive a wafer placed on an upper stage of the shelf at the same time.

RELATED ART DOCUMENTS

Patent Documents

[Patent Document 1] JP 2004-311821 A
[Patent Document 2] JP H07-297255 A

SUMMARY OF INVENTION

Problems to be Solved by the Invention

However, in a substrate placing structure storing a lot of substrates such as the FOUP, there is not an empty stage on which a processed substrate is to be placed, when unprocessed substrates are placed on every stage of the substrate placing structure. Therefore, the technology of Patent Document 2 cannot be applied.

The present invention is made considering the above-stated problems of the conventional technology and its object is to provide a substrate conveying robot capable of shortening the tact time in conveying substrates regardless of kinds of substrate placing structures and a substrate conveying system provided with the robot.

Means for Solving the Problems

In order to achieve the above-stated object, a first aspect of the present invention is a substrate conveying robot for holding and conveying a substrate, comprising: a robot arm; a substrate holding device mounted on the robot arm; and a control device configured to control the robot arm and the substrate holding device, wherein the substrate holding device has a pair of blade members which are arranged in a vertical direction and each of which can hold the substrate and a blade elevating unit configured to relatively move one of the pair of blade members in a vertical direction with respect to an other of the pair of blade members, wherein the control device is configured to make the robot arm and the substrate holding device execute, in a state that the one of the pair of blade members is made into a substrate holding state and the other of the pair of blade members is made into a substrate non-holding state, a blade member advancing operation of advancing the pair of blade members into a substrate placing structure having an upper stage and a lower stage, a substrate receiving operation of receiving a substrate placed on one of the upper stage and the lower stage by the blade member in the substrate non-holding state, and a substrate placing operation of placing the substrate of the blade member in the substrate holding state on an other of the upper stage and the lower stage, and wherein the substrate holding device is configured to be capable of being switched between a first working state that the pair of blade members are arranged in the vertical direction and a second working state that the pair of blade members are arranged in a position out of the vertical direction and a single blade member can be advanced into the substrate placing structure.

A second aspect of the invention is that, in the first aspect, the control device makes the substrate holding device into the second working state prior to the blade member advancing operation, the substrate receiving operation, and the substrate placing operation, and advances the one of the pair of blade members below a substrate placed on a lowermost stage of the substrate placing structure and elevates the one of the pair of blade members so as to make the robot arm and the substrate holding device execute a lowermost stage substrate receiving operation of receiving the substrate placed on the lowermost stage.

A third aspect of the invention is that, in the first or second aspect, a vertical interval of the pair of blade members can be made into 12 mm or less by the blade elevating unit.

A fourth aspect of the invention is that, in any one of the first to third aspects, the substrate conveying robot further comprises a Z-axis elevating unit having a servo motor capable of simultaneously elevating the pair of blade members, wherein the substrate receiving operation is executed by using the Z-axis elevating unit.

A fifth aspect of the invention is that, in any one of the first to fourth aspects, the substrate receiving operation is executed by an upper blade member of the pair of blade members.

A sixth aspect of the invention is that, in any one of the first to fifth aspects, the control device makes both the pair of blade members into a substrate non-holding state and elevates the blade member on a lower side by the blade elevating unit prior to the substrate receiving operation and the substrate placing operation so as to make the robot arm and the substrate holding device execute a lowermost stage substrate receiving operation of receiving a substrate placed on a lowermost stage of the substrate placing structure.

A seventh aspect of the invention is that, in any one of the first to sixth aspect, both the pair of blade members are driven by the blade elevating unit to be elevated.

An eighth aspect of the invention is that, in the seventh aspect, the blade elevating unit can drive each of the pair of blade members to be elevated independently.

A ninth aspect of the invention is that, in the seventh or eighth aspect, the blade elevating unit has a pair of fluid pressure cylinders configured to drive each of the pair of blade members to be elevated, wherein the fluid pressure cylinder for the blade member on an upper side is arranged so that its piston faces downward, and wherein the fluid pressure cylinder for the blade member on a lower side is arranged so that its piston faces upward.

A tenth aspect of the invention is that, in any one of the first to sixth aspects, only one of the pair of blade members is driven by the blade elevating unit to be elevated.

An eleventh aspect of the invention is that, in the tenth aspect, the blade elevating unit has a fluid pressure cylinder configured to drive one of the pair of blade members to be elevated, and wherein the other of the pair of blade members is positioned in an opposite side to a side in which the piston of the fluid pressure cylinder is positioned.

A twelfth aspect of the invention is that, in the tenth or eleventh aspect, the substrate conveying robot further comprises a substrate detection unit having a substrate sensor provided on a distal end portion of the blade member which is not driven by the blade elevating unit to be elevated.

A thirteenth aspect of the invention is that, in any one of the first to twelfth aspects, the substrate conveying robot further comprises a substrate detection unit having a substrate sensor provided on a distal end portion of the blade member which is driven by the blade elevating unit to be elevated.

A fourteenth aspect of the invention is that, in any one of the first to thirteenth aspects, the substrate holding device has a pair of hands arranged in a vertical direction, wherein each of the pair of hands has the blade member, and wherein each of the pair of hands has a plurality of blade members whose vertical interval is fixed mutually.

A fifteenth aspect of the invention is a substrate processing system, comprising: a substrate conveying robot according to any one of the first to fourteenth aspects; and a plurality of different kinds of the substrate placing structures, wherein substrate placing pitches in the substrate placing structures are identical with each other.

Note that the above-mentioned substrate placing structure includes various structures in which at least two substrates can be placed in the vertical direction. For example, a substrate storing container such as the FOUP, a substrate placing shelf (wafer board) as a processing device port, a buffer-type aligner, and the like are included. Here, the buffer-type aligner refers to an aligner comprising a substrate elevating mechanism for making the next substrate stand by above a substrate rotational mechanism.

Advantageous Effect of the Invention

The present invention can provide a substrate conveying robot capable of shortening a tact time in conveying substrates regardless of the kind of fixing method of substrates in a substrate holding device mounted on a robot arm and a substrate conveying system provided with the robot.

EMBODIMENT OF THE INVENTION

Hereunder, a substrate conveying robot according to an embodiment of the present invention will be described referring to the figures. Note that the substrate conveying robot according to the embodiment is particularly suitable for conveying a wafer (circular substrate) for manufacturing semiconductors.

Figure 1:
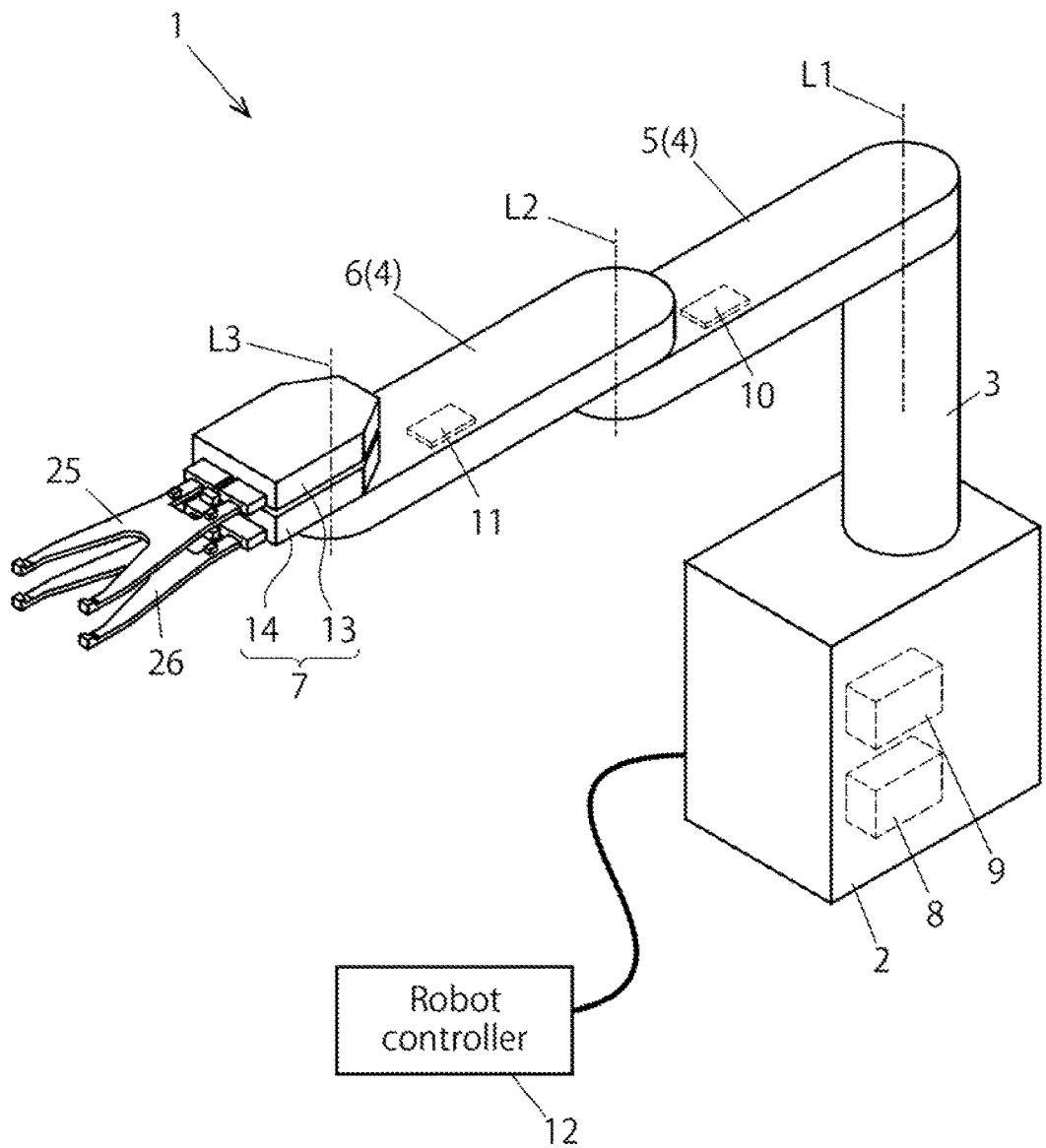
FIG. 1 is a perspective view schematically illustrating a substrate conveying robot according to an embodiment of the present invention.

As illustrated in FIG. 1, a substrate conveying robot 1 according to the embodiment has a base 2. A rotary main shaft 3 is provided on the base 2 so as to elevate along a first rotational axis L1.

The base end of a robot arm 4 is connected on the upper end of the rotary main shaft 3. The robot arm 4 has a first link member 5 having the first rotational axis L1 on the base end thereof and also having a second rotational axis L2 on the distal end thereof, and a second link member 6 having the second rotational axis L2 on the base end thereof and also having a third rotational axis L3 on the distal end thereof. A substrate holding device 7 is provided on the distal end of the second link member 6 so as to rotate about the third rotational axis L3.

The elevating operation and the rotating operation of the rotary main shaft 3 are performed by a Z-axis elevating drive source 8 and a turning drive source 9 provided inside the base 2 respectively. The rotary main shaft 3 rotates about the first rotational axis L1 so that the first link member 5 rotates about the first rotational axis L1 integrally with the rotary main shaft 3.

The rotational operation of the second link member 6 with respect to the first link member 5 is performed by a drive source 10 provided inside the first link member 5. The rotating operation of the substrate holding device 7 with respect to the second link member 6 is performed by a drive source 11 provided inside the second link member 6.

The above-stated Z-axis elevating drive source 8 configures a Z-axis elevating unit in the present invention, and the substrate holding device 7 can be elevated by elevating the robot arm 4 by the Z-axis elevating drive source. The drive sources 8, 9, 10, 11 can be configured by servo motors, for example.

Each drive source 8, 9, 10, 11 is controlled by a robot controller (control device) 12. Thereby, the elevating operation and the rotating operation of the robot arm 4 having the substrate holding device 7 are controlled.

Note that a configuration of a robot arm of the substrate conveying robot according to the present invention and its drive means is not limited to the above-mentioned configuration illustrated in FIG. 1, and any configuration capable of positioning a substrate holding device to a substrate to be conveyed can be employed.

Figure 2:
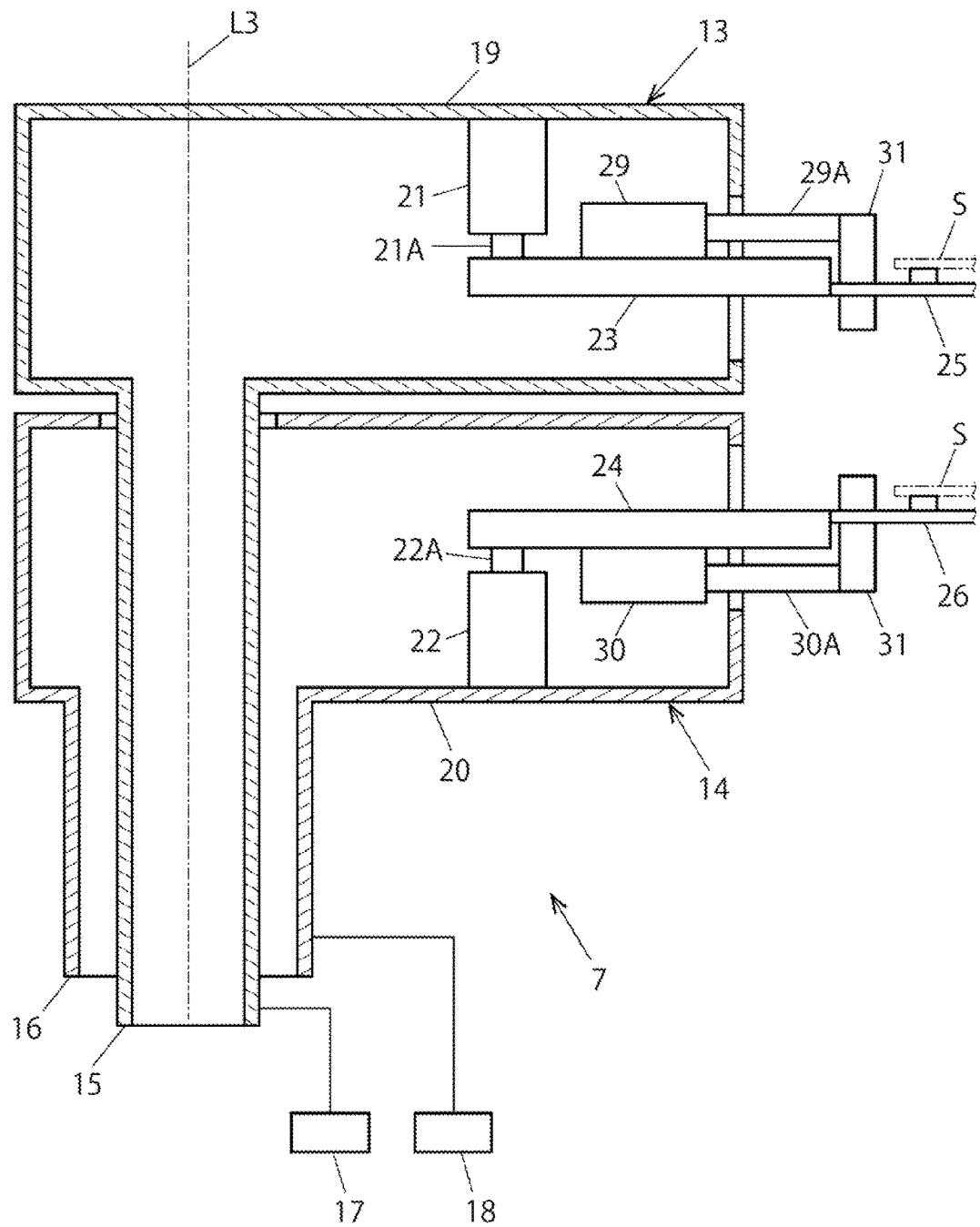
FIG. 2 is a schematic sectional view of the internal structure of a hand of the substrate conveying robot in FIG. 1, illustrating the state that a vertical interval of upper and lower blade members is made maximum.
Figure 3:
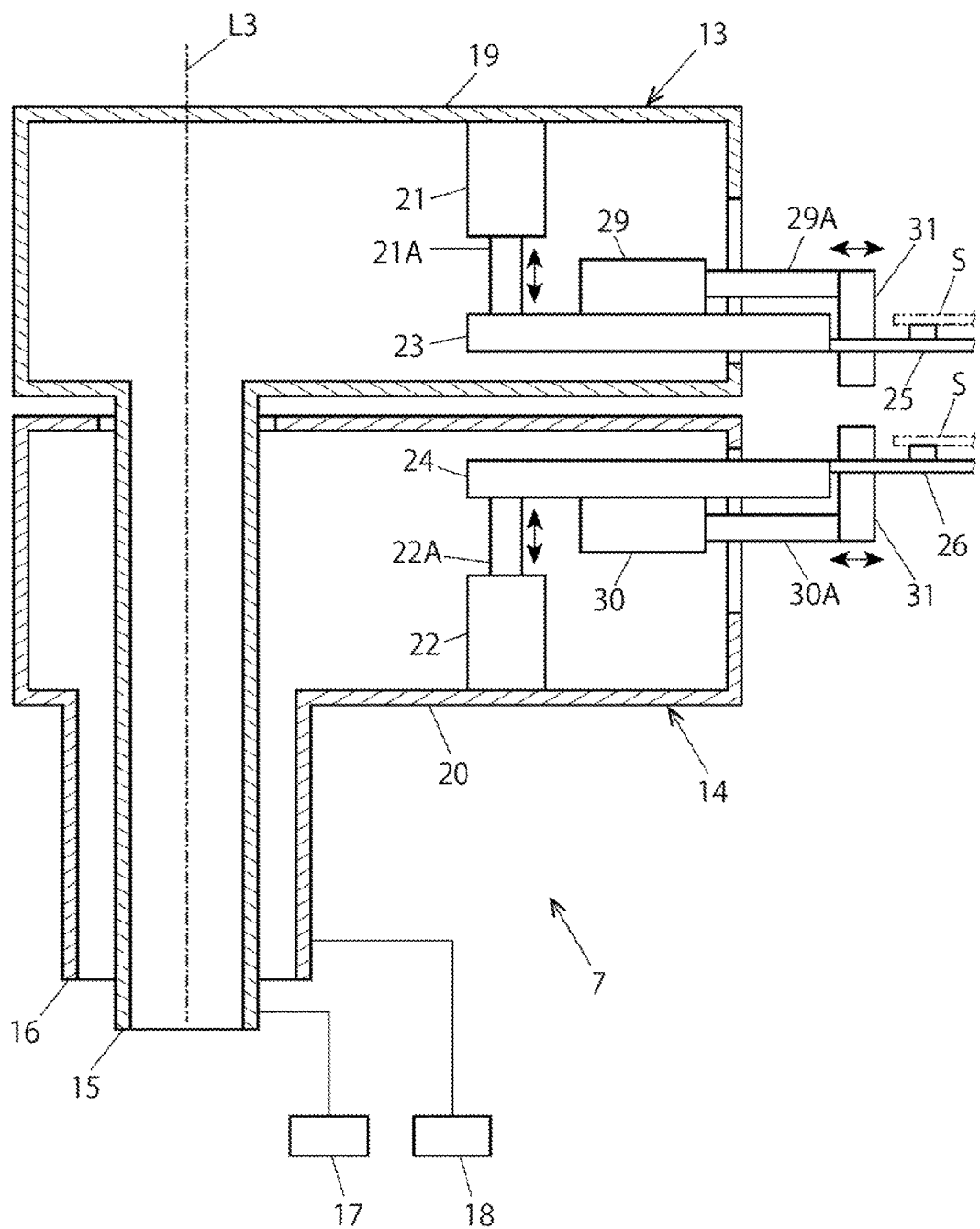
FIG. 3 is a schematic sectional view of the internal structure of a hand of the substrate conveying robot in FIG. 1, illustrating the state that a vertical interval of upper and lower blade members is made minimum.

As illustrated in FIG. 2 and FIG. 3, the substrate holding device 7 mounted on the distal end of the robot arm 4 has an upper hand 13 and a lower hand 14 arranged in the vertical direction having the third rotational axis L3 as a common rotational axis. The upper hand 13 has an inner wrist shaft 15 extending along the third rotational axis L3 and the lower hand 14 has an outer wrist shaft 16 extending along the third rotational axis L3 outside the inner wrist shaft 15. The upper hand 13 and the lower hand 14 have wrist shaft drive sources 17, 18 respectively and can rotate about the third rotational axis L3 independently from each other. The wrist shaft drive sources 17, 18 can be configured by servo motors.

The upper hand 13 has an upper hand base portion 19 consisting of a hollow member connected to the upper end of the inner wrist shaft 15 and the lower hand 14 has a lower hand base portion 20 consisting of a hollow member connected to the upper end of the outer wrist shaft 16. An upper elevating air cylinder 21 is provided inside the upper hand base portion 19 with its piston 21A facing downward, and a lower elevating air cylinder 22 is provided inside the lower hand base portion 20 with its piston 22A facing downward.

An upper elevating member 23 is connected to the distal end of the piston 21A of the upper elevating air cylinder 21, and a lower elevating member 24 is connected to the distal end of the piston 22A of the lower elevating air cylinder 22. The base end portion of an upper blade member 25 holding a substrate S is connected to the upper elevating member 23, and the base end portion of a lower blade member 26 holding the substrate S is connected the lower elevating member 24. The upper elevating air cylinder 21, the lower elevating air cylinder 22, the upper elevating member 23, and the lower elevating member 24 configure a blade elevating unit in the present invention.

The upper elevating air cylinder 21 and the lower elevating air cylinder 22 can be driven independently from each other by the robot controller 12. Therefore, four states can be switched appropriately therebetween with respect to the arrangement of the upper blade member 25 and the lower blade member 26 in the vertical direction. Namely, four states: a first arrangement state (minimum pitch) that the upper blade member 25 is in the lower position and the lower blade member 26 is in the upper position, a second arrangement state (maximum pitch) that the upper blade member 25 is in the upper position and the lower blade member 26 is in the lower position, a third arrangement state (lower middle pitch) that the upper blade member 25 is in the lower position and the lower blade member 26 is in the lower position, and a fourth arrangement state (upper middle pitch) that the upper blade member 25 is in the upper position and the lower blade member 26 is in the upper position can be switched appropriately therebetween.

Since the piston 21A of the upper elevating air cylinder 21 faces downward and the piston 22A of the lower elevating air cylinder 22 faces upward as stated above, the minimum interval (minimum pitch) between the upper blade member 25 and the lower blade member 26 in the vertical direction can be small as illustrated in FIG. 3.

For example, the minimum interval (minimum pitch) between the upper blade member 25 and the lower blade member 26 in the vertical direction can be set to 12 mm or less. Thereby, the substrate receiving operation and the substrate placing operation by the substrate conveying robot according to the present invention can be performed without any problem also to a substrate placing structure with a small substrate placing pitch such as a FOUP.

Figure 4:
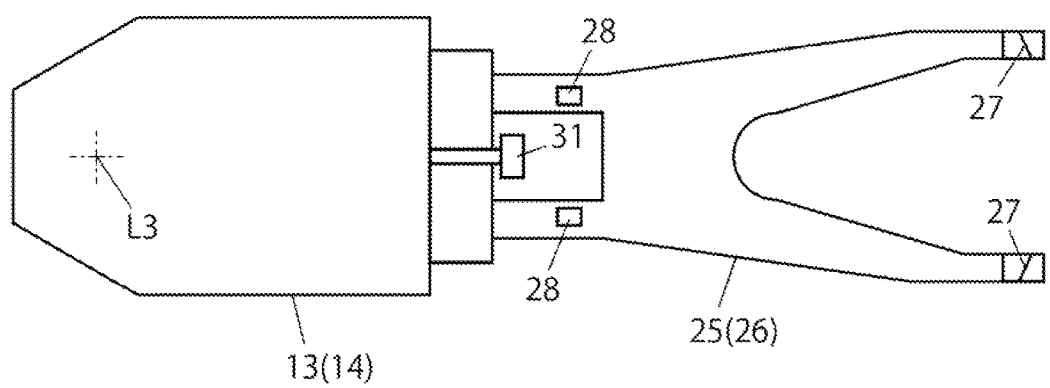
FIG. 4 is an enlarged schematic plan view illustrating an upper hand of the substrate conveying robot in FIG. 1.
Figure 5:
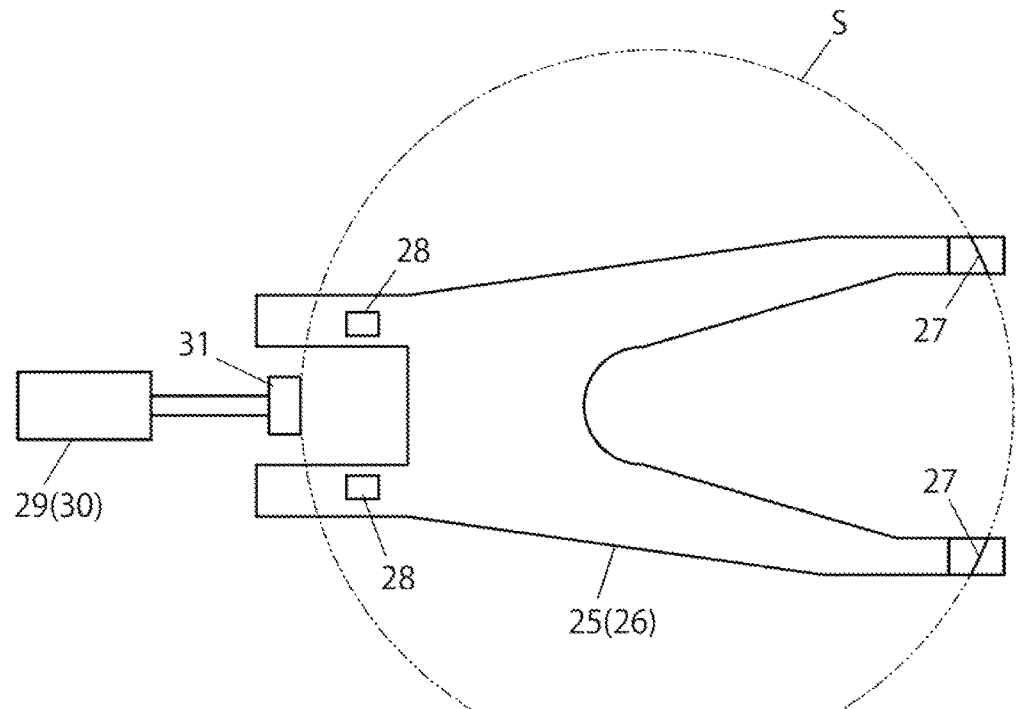
FIG. 5 is a schematic plan view illustrating the state that a substrate is held by a substrate holding device of the substrate conveying robot in FIG. 1.

As illustrated in FIG. 4 and FIG. 5, a pair of fixed gripping portions 27 abutted on edge portions of the substrate S are provided to the respective distal end portions of the upper blade member 25 and the lower blade member 26. A pair of bottom surface supporting portions 28 supporting the bottom surface of the substrate S are provided on the upper surface of the respective base end portions of the upper blade member 25 and the lower blade member 26.

As illustrated in FIG. 2 and FIG. 3, an upper pressing air cylinder 29 is provided on the upper surface of the upper elevating member 23 with its piston 29A facing forward, and a lower pressing air cylinder 30 is provided on the lower surface of the lower elevating member 24 with its piston 30A facing forward.

A movable gripping portion 31 for pressing the substrate S so as to grip the substrate S together with the fixed gripping portion 27 is provided to the distal end of the piston 29A of the upper pressing air cylinder 29. Similarly, the movable gripping portion 31 for pressing the substrate S so as to grip the substrate S together with the fixed gripping portion 27 is provided to the distal end of the piston 30A of the lower pressing air cylinder 29.

The upper pressing air cylinder 29 and the lower pressing air cylinder 30 can be driven independently from each other by the robot controller 12. Accordingly, the movable gripping portion 31 of the upper hand 13 and the movable gripping portion 31 of the lower hand 14 can be driven independently from each other.

Also, the upper pressing air cylinder 29 and the lower pressing air cylinder 30 are provided to the upper elevating member 23 and the lower elevating member 24 respectively, and also the upper blade member 25 and the lower blade member 26 are provided to the upper elevating member 23 and the lower elevating member 24 respectively. Therefore, each movable gripping portion 31 is elevated interlockingly with the elevating operation of each blade member 25, 26.

The substrate holding device 7 is configured so as to be switched between a first working state that the upper blade member 25 and the lower blade member 26 are arranged in the vertical direction and a second working state that the upper blade member 25 and the lower blade member 26 are arranged in a position displaced from the vertical direction and only one of the upper blade member 25 and the lower blade member 26 can be advanced into the substrate placing structure such as the FOUP.

Figure 6:
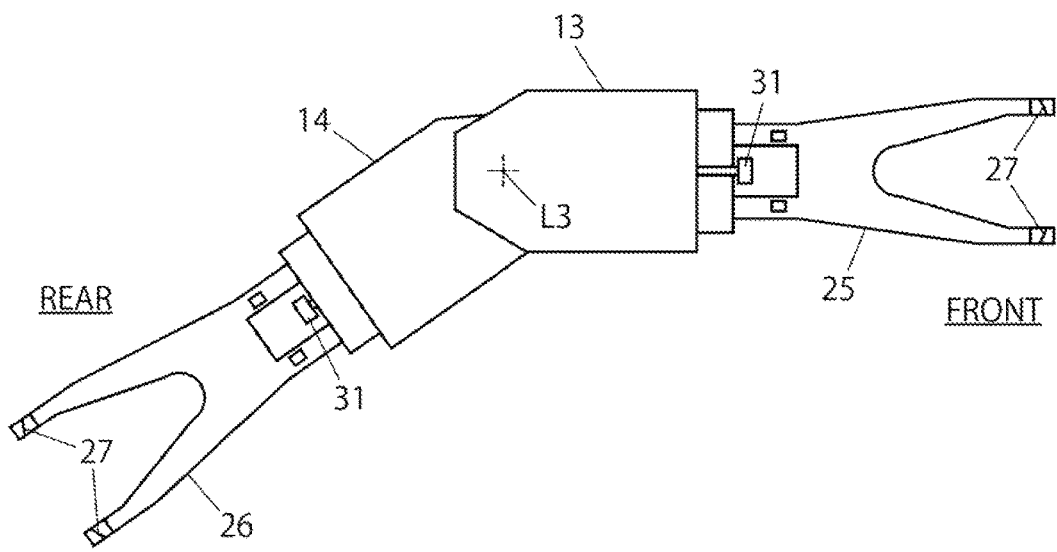
FIG. 6 is a schematic plan view illustrating that a substrate holding device of the substrate conveying robot illustrated in FIG. 1 is in a second working state, illustrating the state that the upper hand faces the advancing direction.
Figure 7:
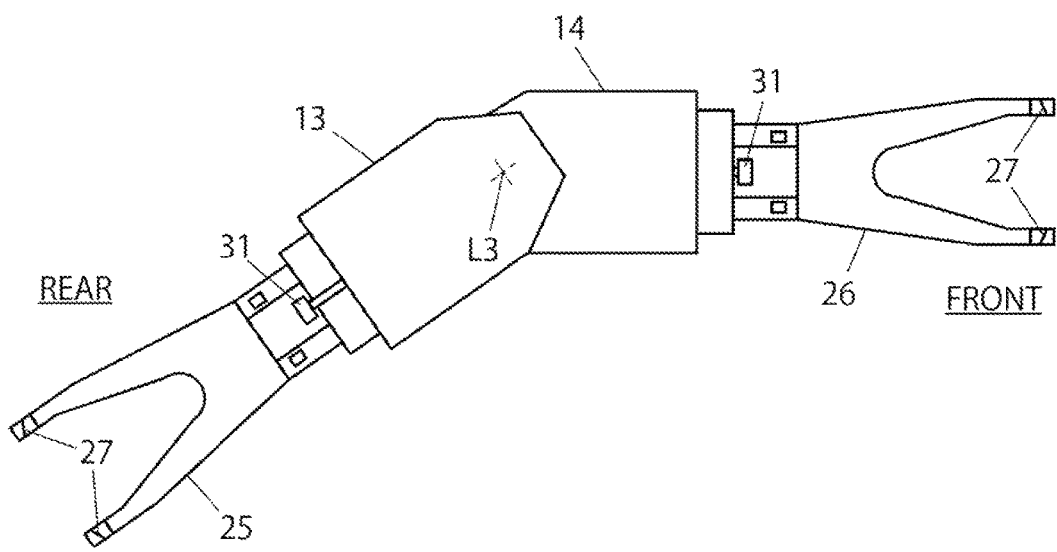
FIG. 7 is a schematic plan view illustrating that a substrate holding device of the substrate conveying robot illustrated in FIG. 1 is in a second working state, illustrating the state that the lower hand faces the advancing direction.

In the second working state, the lower hand 14 can be retreated to a non-working position keeping the upper hand 13 in the working position as illustrated in FIG. 6, or the upper hand 13 can be retreated to the non-working position keeping the lower hand 14 in the working position as illustrated in FIG. 7. Here, "working position" refers to a position where a hand can be advanced into the substrate placing structure such as the FOUP, and "non-working position" refers to a position where the other hand is retreated so as not to interrupt the substrate conveying operation by one hand in the working position.

Figure 8:
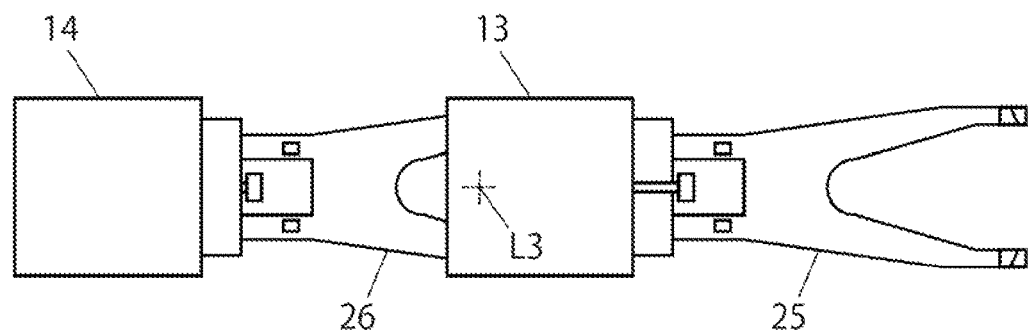
FIG. 8 is a schematic plan view illustrating that a substrate holding device as a modified example of the substrate conveying robot illustrated in FIG. 1 is in a second working state, illustrating the state that the upper hand faces the advancing direction.
Figure 9:
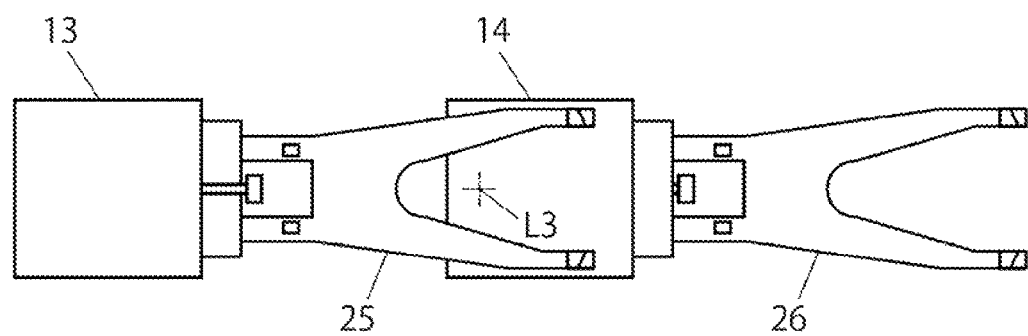
FIG. 9 is a schematic plan view illustrating that a substrate holding device as a modified example of the substrate conveying robot illustrated in FIG. 1 is in a second working state, illustrating the state that the lower hand faces the advancing direction.

Note that, as a modified example, one of the upper hand 13 and the lower hand 14 may be moved to the rear with respect to the other so as to arrange the same in the non-working position, as illustrated in FIG. 8 and FIG. 9.

The position of the third rotational axis L3 of the hand in the working position does not change in both the rotational retreating type illustrated in FIG. 6 and FIG. 7 and the linearly retreating type illustrated in FIG. 8 and FIG. 9, and therefore the effective length of an arm does not change. Therefore, there is an advantage that differences in sagging of the robot arm 4 due to its weight do not arise when switching between the working position/non-working position of the upper hand 13 and the lower hand 14. The differences in sagging of the robot arm 4 due to its weight become a problem particularly in the case of the double-arm type.

Next, the operation when driving the robot arm 4 and the substrate holding device 7 by the above-stated robot controller 12 so as to receive a processed substrate from the upper stage of the substrate placing structure and place an unprocessed substrate on the lower stage of the substrate placing structure will be described referring to FIG. 10A to FIG. 10G.

Note that the substrate placing structure 100 illustrated in FIG. 10A to FIG. 10G is a buffer-type aligner, for example, that the lower stage of the substrate placing structure 100 configures a rotational mechanism of the aligner and the upper stage of the substrate placing structure 100 configures a substrate elevating mechanism where the next substrate is made standby above the rotational mechanism.

Figure 10A:
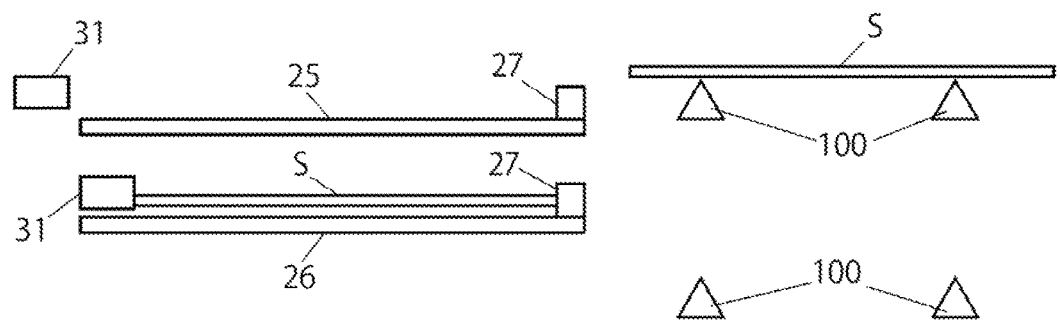
FIG. 10A is schematic view illustrating an operation when receiving a processed substrate and placing an unprocessed substrate using the substrate conveying robot illustrated in FIG. 1.

First, the upper blade 25 is made in the substrate non-holding state and the lower blade member 26 is made in the substrate holding state, as illustrated in FIG. 10A.

Figure 10B:
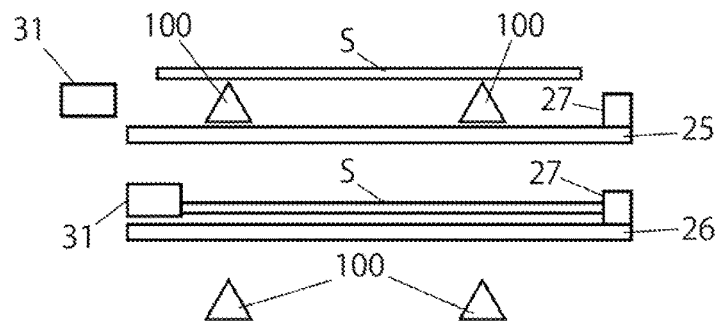
FIG. 10B is another schematic view illustrating an operation when receiving a processed substrate and placing an unprocessed substrate using the substrate conveying robot illustrated in FIG. 1.

Next, the robot arm 4 is driven so as to advance the upper blade member 25 and the lower blade member 26 between the upper stage and the lower stage of the substrate placing structure 100 as illustrated in FIG. 10B (blade member advancing operation). At this time, the upper blade member 25 and the lower blade member 26 are advanced until the fixed gripping portion 27 of the upper blade member 25 exceeds the position of a distal edge portion of the substrate S placed on the upper stage of the substrate placing structure 100.

Figure 10C:
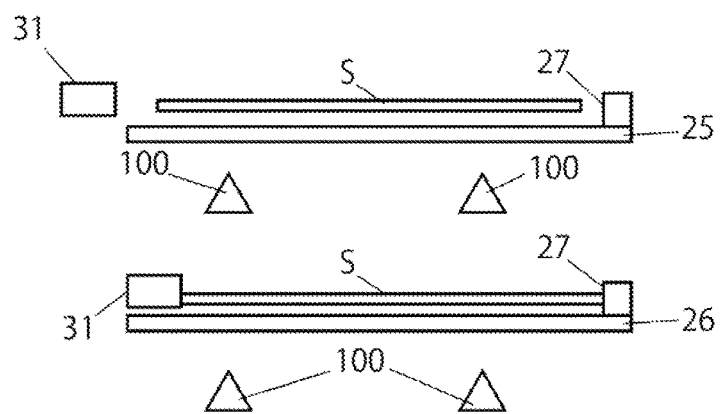
FIG. 10C is another schematic view illustrating an operation when receiving a processed substrate and placing an unprocessed substrate using the substrate conveying robot illustrated in FIG. 1.

Next, the upper elevating air cylinder 21 is driven so as to elevate the upper blade member 25 and receive the substrate S by the upper blade member 25 in the state that the movable gripping portion 31 of the upper hand 13 is retreated to the non-gripping position as illustrated in FIG. 10C (substrate receiving operation). At this time, the fixed gripping portion 27 of the upper blade member 25 is arranged in a position slightly exceeding a distal edge portion of the substrate S placed on the upper stage of the substrate placing structure. Therefore, the substrate S is prevented from getting on a protruding part configuring the fixed gripping portion 27.

Figure 10D:
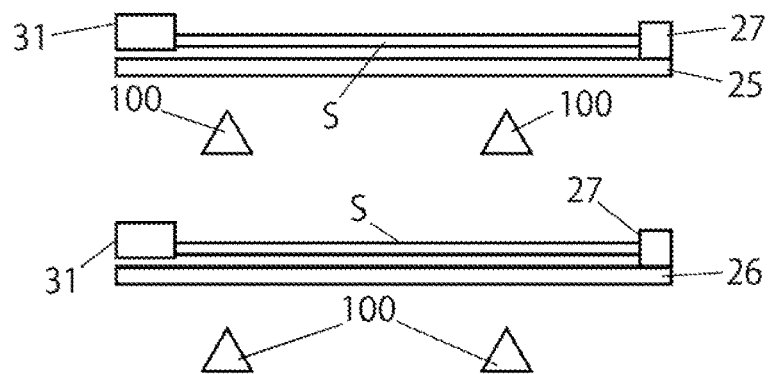
FIG. 10D is another schematic view illustrating an operation when receiving a processed substrate and placing an unprocessed substrate using the substrate conveying robot illustrated in FIG. 1.

Next, the upper pressing air cylinder 29 is driven so as to advance the movable gripping portion 31 of the upper hand 13 and grip and hold the substrate S by the movable gripping portion 31 of the upper hand 13 and the fixed gripping portion 27 as illustrated in FIG. 10D. Thereby, the holding operation of the substrate S by the upper hand 13 is completed.

Then, the robot arm 4 is driven so as to slightly retreat the upper hand 13 and the lower hand 14 at the same time as the above-stated substrate receiving operation or after the substrate receiving operation is completed so that the substrate S held by the lower blade member 26 is arranged above the placing position of the lower stage of the substrate placing structure 100, as illustrated in FIG. 10D.

Figure 10E:
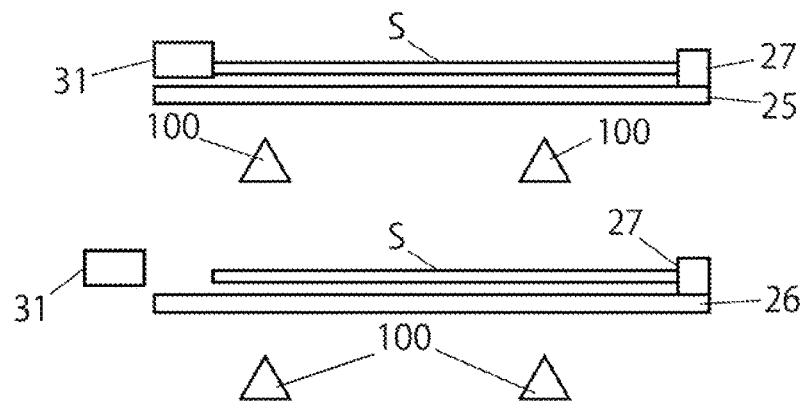
FIG. 10E is another schematic view illustrating an operation when receiving a processed substrate and placing an unprocessed substrate using the substrate conveying robot illustrated in FIG. 1.
Figure 10F:
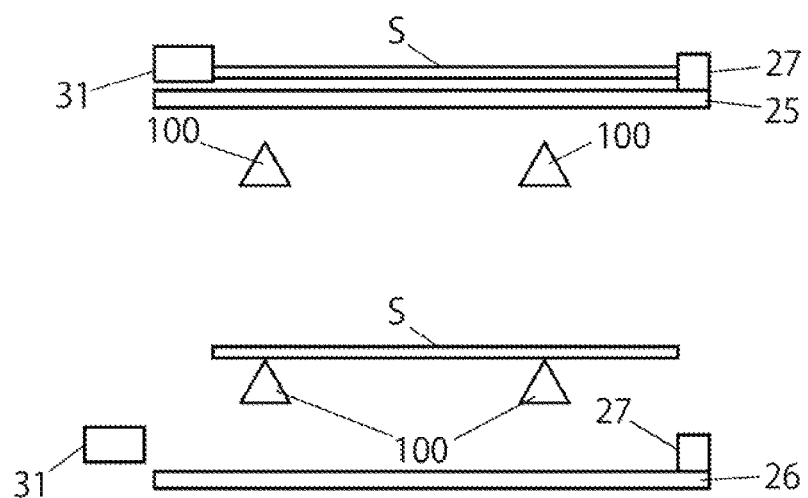
FIG. 10F is another schematic view illustrating an operation when receiving a processed substrate and placing an unprocessed substrate using the substrate conveying robot illustrated in FIG. 1.

Next, the lower pressing air cylinder 30 is driven so as to retreat the movable gripping portion 31 of the lower hand 14 to the non-gripping position, as illustrated in FIG. 10E. Next, the lower elevating air cylinder 22 is driven so as to lower the lower blade member 26 and place the substrate S on the lower stage of the substrate placing structure 100, as illustrated in FIG. 10E. Thereby, the substrate placing operation by the lower hand 14 is completed.

Figure 10G:
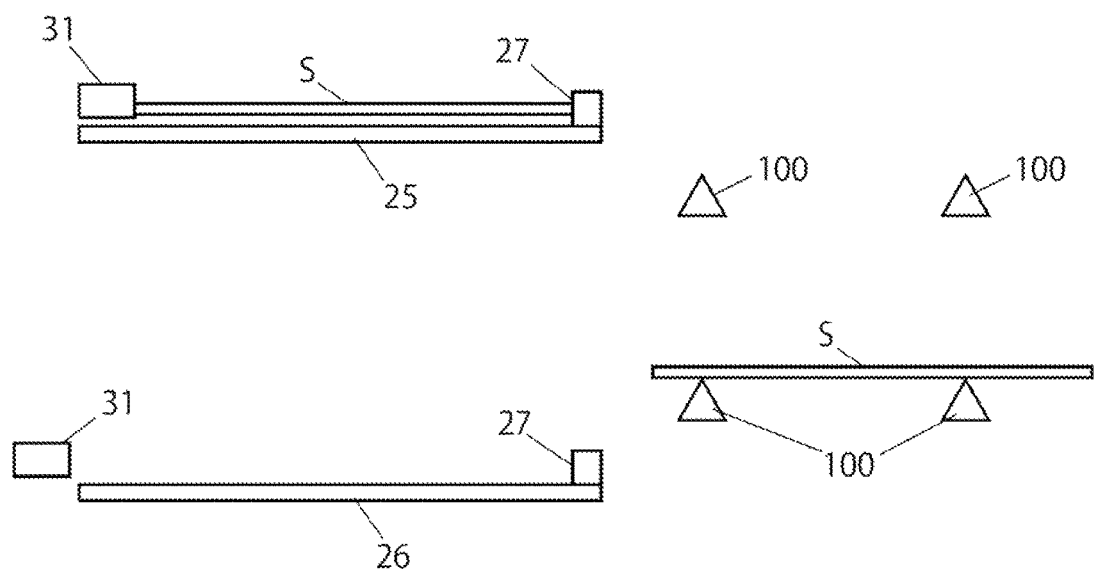
FIG. 10G is another schematic view illustrating an operation when receiving a processed substrate and placing an unprocessed substrate using the substrate conveying robot illustrated in FIG. 1.

Next, the robot arm 4 is driven so as to retreat the upper blade member 25 and the lower blade member 26 and convey the processed substrate S to another substrate placing structure, as illustrated in FIG. 10G.

As described above using the FIG. 10A to FIG. 10G, a timing to receive the processed substrate S by the substrate receiving operation and a timing to place the unprocessed substrate S by the substrate placing operation are deviated from each other when receiving the processed substrate S and placing the unprocessed substrate S using the substrate conveying robot 1 according to according to the embodiment. Thereby, the upper blade member 25 can be arranged in a position slightly overreaching forward (in the distal direction) so that the substrate S does not get on the protrusion part configuring the fixed gripping portion 27 in the substrate receiving operation.

Also, when the processed substrate S is a cleaned substrate, adhesion of particles to the substrate S due to downflow for keeping cleanliness in a semiconductor manufacturing area can be prevented by always holding the processed substrate S by the upper blade member 25.

Next, another operation when driving the robot arm 4 and the substrate holding device 7 by the above-stated robot controller 12 so as to place the unprocessed substrate S on the lower stage of the substrate placing structure 100 and receive the processed substrate S from the upper stage of the substrate placing structure 100 will be described referring to FIG. 11A to FIG. 11H.

Figure 11A:
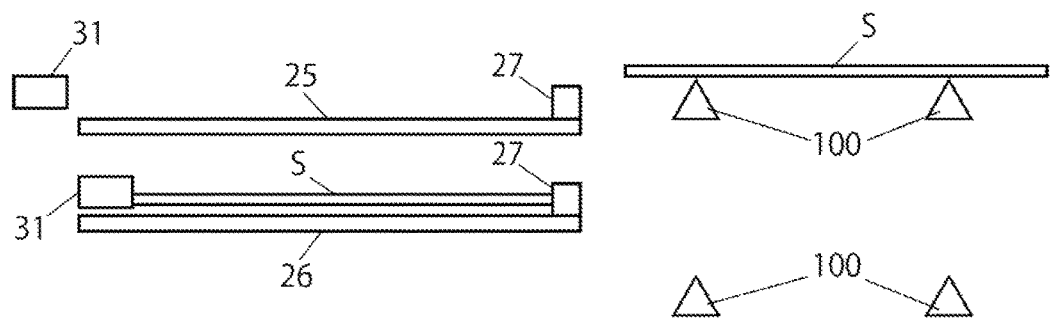
FIG. 11A is a schematic view illustrating another operation when placing an unprocessed substrate and receiving a processed substrate using the substrate conveying robot illustrated in FIG. 1.

First, as illustrated in FIG. 11A, the upper blade member is made into the substrate non-holding state and the lower blade member is made into the substrate holding state.

Figure 11B:
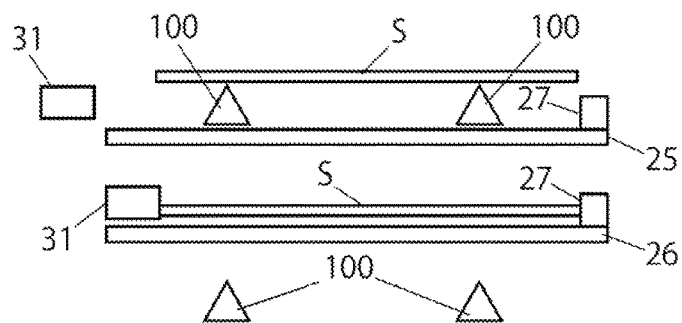
FIG. 11B is another schematic view illustrating another operation when placing an unprocessed substrate and receiving a processed substrate using the substrate conveying robot illustrated in FIG. 1.

Next, the robot arm 4 is driven so as to advance the upper blade member 25 and the lower blade member 26 between the upper stage and the lower stage of the substrate placing structure 100 as illustrated in FIG. 11B (blade member advancing operation). At this time, the lower blade member 26 and the upper blade member 25 are advanced so that the substrate S held by the blade member 26 is arranged in a position corresponding to the substrate placing position of the lower stage of the substrate placing structure 100.

Figure 11C:
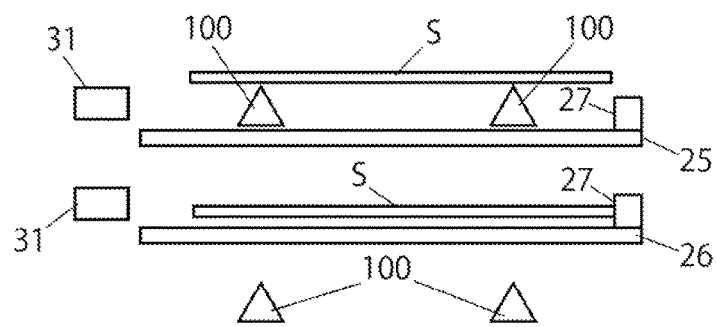
FIG. 11C is another schematic view illustrating another operation when placing an unprocessed substrate and receiving a processed substrate using the substrate conveying robot illustrated in FIG. 1.
Figure 11D:
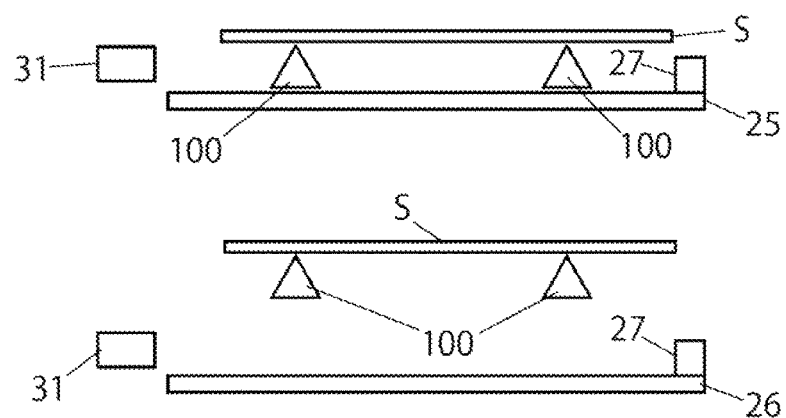
FIG. 11D is another schematic view illustrating another operation when placing an unprocessed substrate and receiving a processed substrate using the substrate conveying robot illustrated in FIG. 1.

Next, as illustrated in FIG. 11C, the lower pressing air cylinder 30 is driven so as to retreat the movable gripping portion 31 of the lower hand 14 to the non-gripping position. Next, the lower elevating air cylinder 22 is driven so as to lower the lower blade member 26 as illustrated in FIG. 11D and place the substrate S on the lower stage of the substrate placing structure 100. Thereby, the substrate placing operation by the lower hand 14 is completed.

Figure 11E:
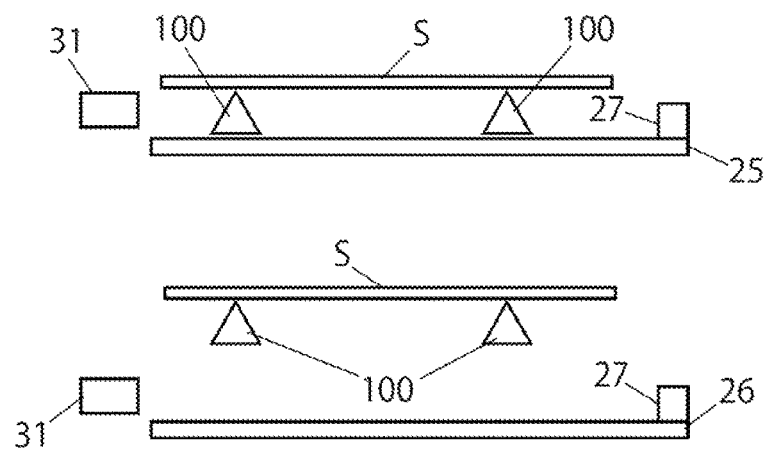
FIG. 11E is another schematic view illustrating another operation when placing an unprocessed substrate and receiving a processed substrate using the substrate conveying robot illustrated in FIG. 1.

Next, the robot arm 4 is driven so as to advance the upper blade member 25 and the lower blade member 26 until the fixed gripping portion 27 of the upper blade member 25 slightly exceeds the position of a distal edge portion of the substrate S placed on the upper stage of the substrate placing structure 100 as illustrated in FIG. 11E.

Figure 11F:
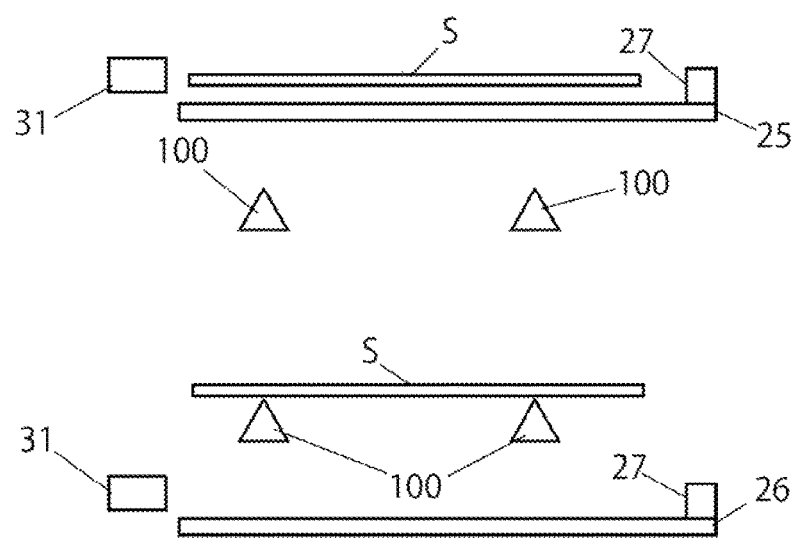
FIG. 11F is another schematic view illustrating another operation when placing an unprocessed substrate and receiving a processed substrate using the substrate conveying robot illustrated in FIG. 1.

Next, in the state that the movable gripping portion 31 of the upper hand 13 is retreated to the non-gripping position, the upper elevating air cylinder 21 is driven so as to elevate the upper blade member 25 and receive the substrate S by the upper blade member 25 as illustrated in FIG. 11F. At this time, the fixed gripping portion 27 of the upper blade member 25 is arranged in a position slightly exceeding the distal edge portion of the substrate S placed on the upper stage of the substrate placing structure 100, and therefore the substrate S does not get on the protrusion part configuring the fixed gripping portion 27.

Figure 11G:
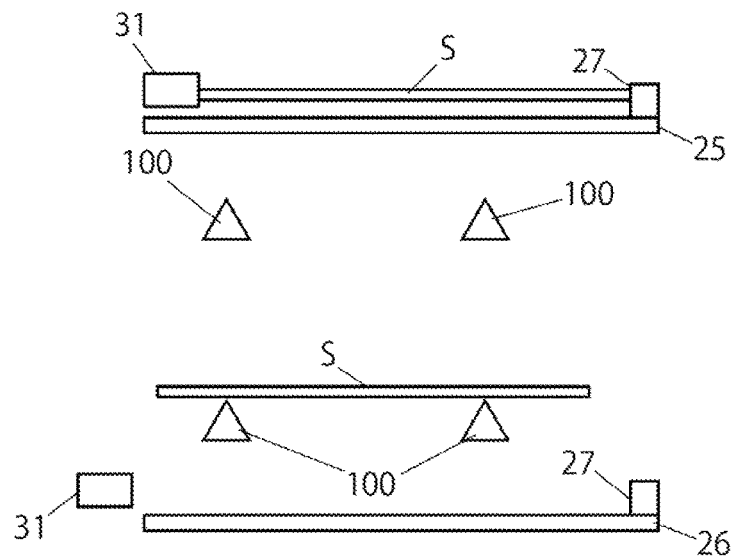
FIG. 11G is another schematic view illustrating another operation when placing an unprocessed substrate and receiving a processed substrate using the substrate conveying robot illustrated in FIG. 1.

Next, the upper pressing air cylinder 29 is driven so as to advance the movable gripping portion 31 of the upper hand 13, and the substrate S is gripped and held by the movable gripping portion 31 of the upper hand 13 and the fixed gripping portion 27 as illustrated in FIG. 11G. Thereby, the holding operation of the substrate S by the upper hand 13 is completed.

Figure 11H:
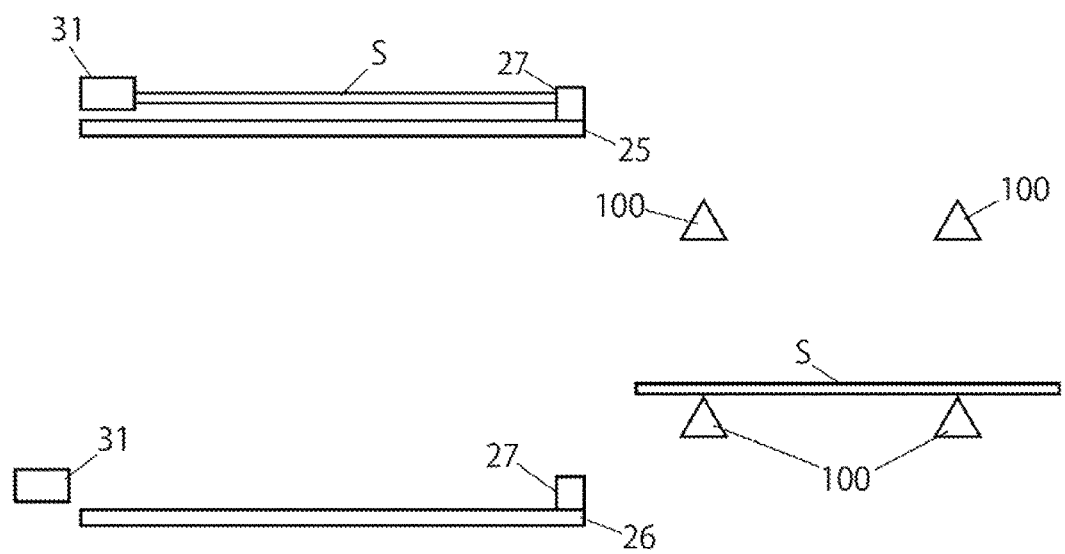
FIG. 11H is another schematic view illustrating another operation when placing an unprocessed substrate and receiving a processed substrate using the substrate conveying robot illustrated in FIG. 1.

Next, the robot arm 4 is driven so as to retreat the upper blade member 25 and the lower blade member 26 and convey the processed substrate S to another substrate placing structure as illustrated in FIG. 11H.

As described above using FIG. 11A to 11H, a timing to place the unprocessed substrate S by the substrate placing operation and a timing to receive the processed substrate S by the substrate receiving operation are deviated from each other when receiving the unprocessed substrate S and placing the processed substrate S using the substrate conveying robot 1 according to the embodiment. Thereby, the upper blade member 25 can be arranged in a position slightly overreaching forward (in the distal direction) so that the substrate S does not get on the protrusion part configuring the fixed gripping portion 27 in the substrate receiving operation.

Also, when the processed substrate S is a cleaned substrate, adhesion of particles to the substrate S due to downflow for keeping cleanliness in a semiconductor manufacturing area can be prevented by always holding the processed substrate S by the upper blade member 25.

Next, another operation when driving the robot arm 4, the substrate holding device 7, and the Z-axis elevating drive source 8 by the above-stated robot controller 12 so as to receive the processed substrate S from the upper stage of the substrate placing structure 100 and place the unprocessed substrate S on the lower stage of the substrate placing structure 100 will be described referring to FIG. 12A to FIG. 12E.

Figure 12A:
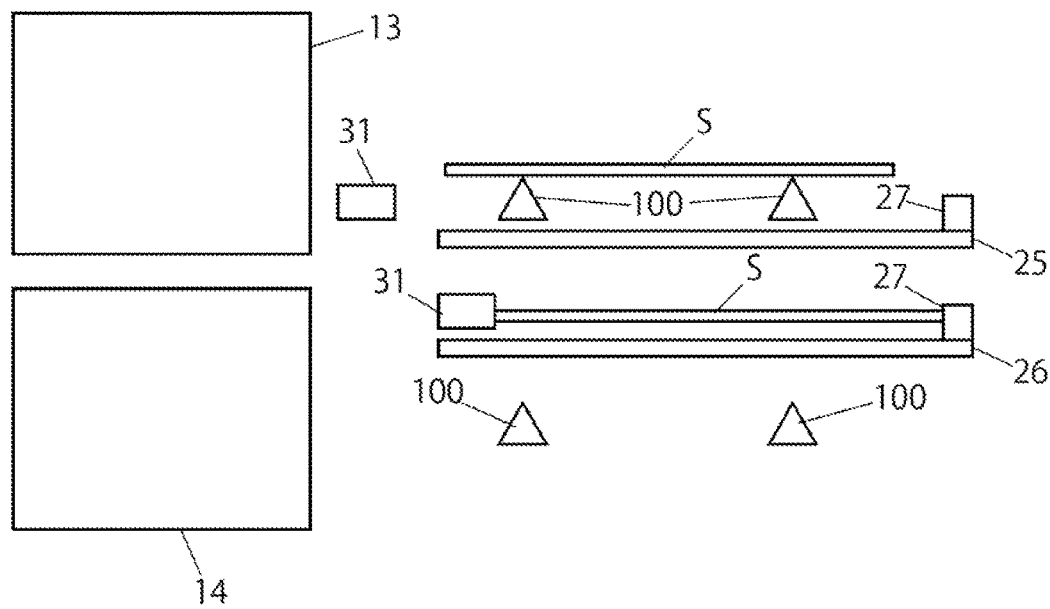
FIG. 12A is a schematic view illustrating further another operation when receiving a processed substrate and placing an unprocessed substrate using the substrate conveying robot illustrated in FIG. 1.

First, as illustrated in FIG. 12A, the upper blade member 25 is made into the substrate non-holding state and the lower blade member 26 is made into the substrate holding state. Then the upper blade member 25 and the lower blade member 26 are advanced between the upper stage and the lower stage of the substrate placing structure 100 (blade member advancing operation). At this time, the upper blade member 25 and the lower blade member 26 are advanced until the fixed gripping portion 27 of the upper blade member 25 slightly exceeds the position of a distal edge portion of the substrate S placed on the upper stage of the substrate placing structure 100.

Figure 12B:
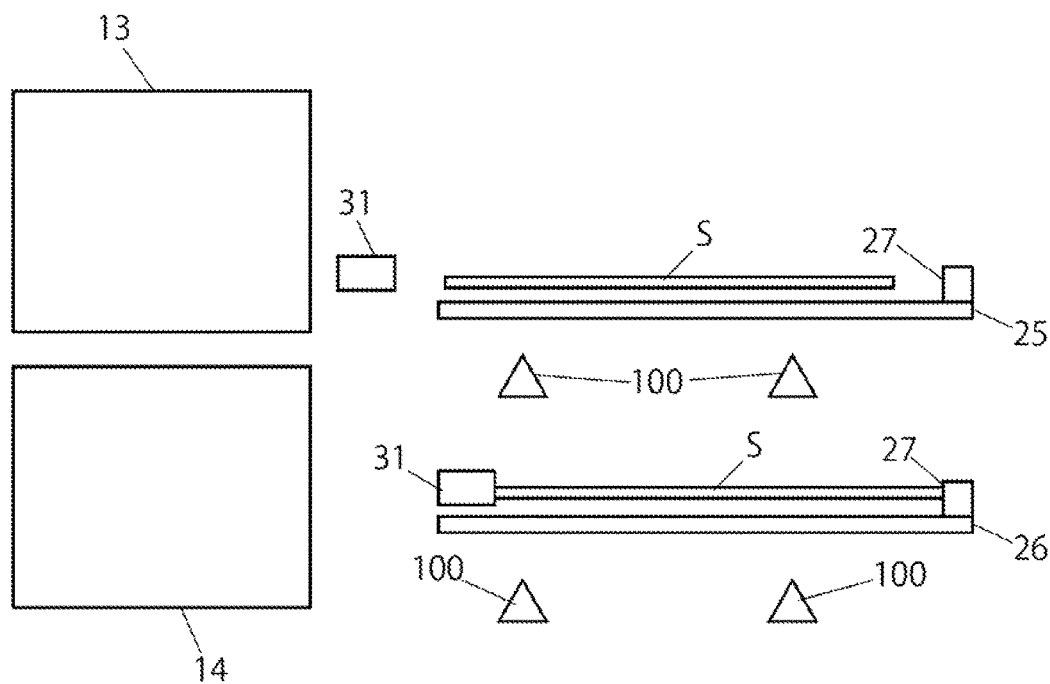
FIG. 12B is another schematic view illustrating further another operation when receiving a processed substrate and placing an unprocessed substrate using the substrate conveying robot illustrated in FIG. 1.

Next, the Z-axis elevating drive source 8 having a servo motor is driven so as to elevate the upper hand 13 and the lower hand 14 and receive the substrate S by the upper blade member 25 in the state that the movable gripping portion 31 of the upper hand 13 is retreated to the non-gripping position as illustrated in FIG. 12B (substrate receiving operation). At this time, the fixed gripping portion 27 of the upper blade member 25 is arranged in a position slightly exceeding the distal edge portion of the substrate S placed on the upper stage of the substrate placing structure 100. Therefore, the substrate S is prevented from getting on the protrusion part configuring the fixed gripping portion 27.

In the substrate receiving operation, the lower elevating air cylinder 22 is driven so as to lower the lower blade member 26 according to the elevating operation of the upper hand 13 and the lower hand 14 by the Z-axis elevating drive source 8. Thereby, the unprocessed substrate S held by the lower blade member 26 does not come into contact with the lower stage of the substrate placing structure 100.

Figure 12C:
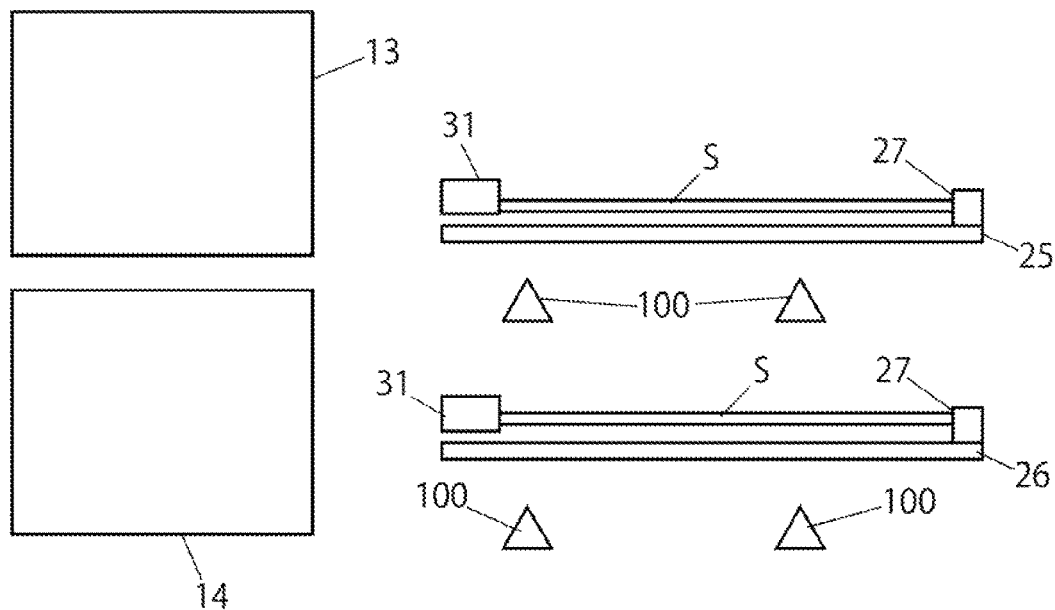
FIG. 12C is another schematic view illustrating further another operation when receiving a processed substrate and placing an unprocessed substrate using the substrate conveying robot illustrated in FIG. 1.

Next, the upper pressing air cylinder 29 is driven so as to advance the movable gripping portion 31 of the upper hand 13 and grip and hold the substrate S by the movable gripping portion 31 of the upper hand 13 and the fixed gripping portion 27 as illustrated in FIG. 12C. Thereby, the holding operation of the substrate S by the upper hand 13 is completed.

The robot arm 4 is driven so as to slightly retreat the upper hand 13 and the lower hand 14 at the same time as the above-stated substrate receiving operation or after the substrate receiving operation is completed so that the substrate S held by the lower hand 14 is arranged above the placing position of the lower stage of the substrate placing structure 100, as illustrated in FIG. 12C.

Figure 12D:
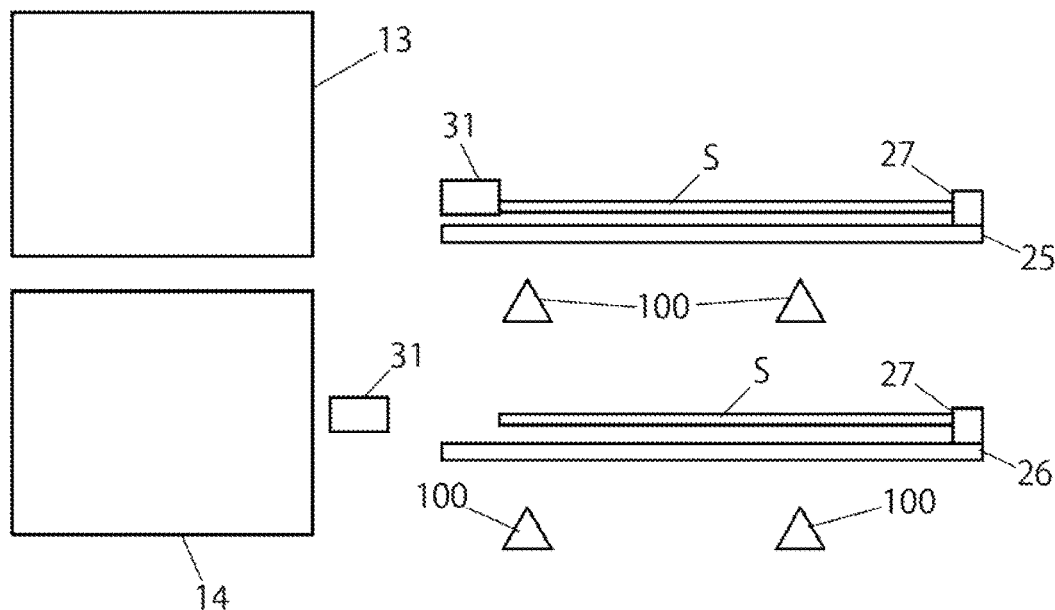
FIG. 12D is another schematic view illustrating further another operation when receiving a processed substrate and placing an unprocessed substrate using the substrate conveying robot illustrated in FIG. 1.
Figure 12E:
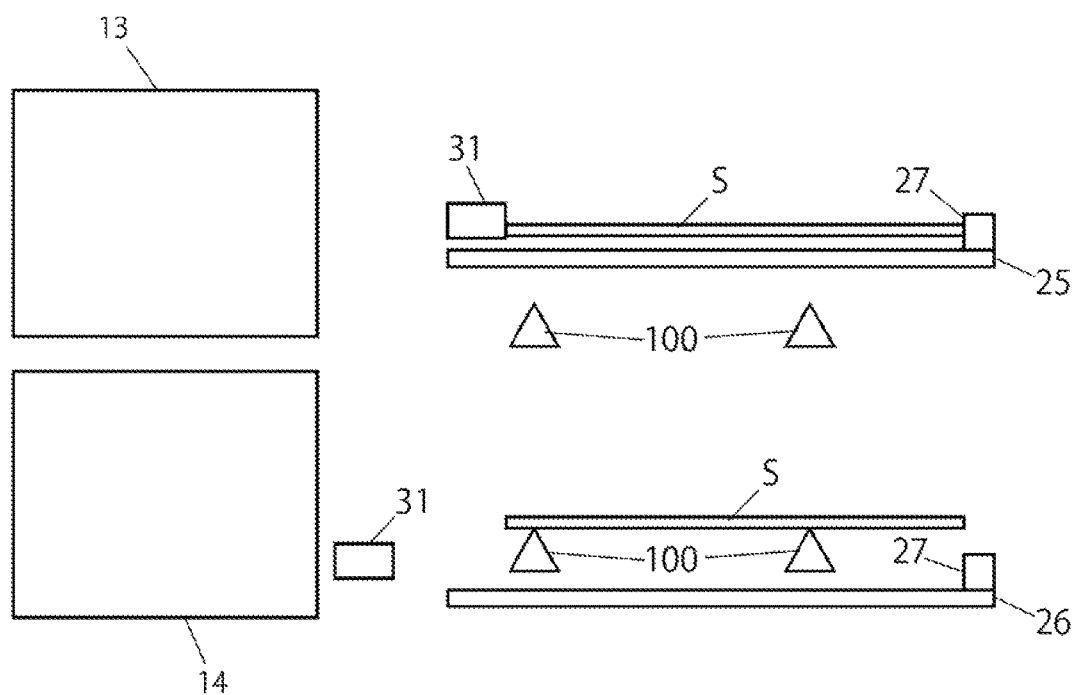
FIG. 12E is another schematic view illustrating further another operation when receiving a processed substrate and placing an unprocessed substrate using the substrate conveying robot illustrated in FIG. 1.

Next, the lower pressing air cylinder 30 is driven so as to retreat the movable gripping portion 31 of the lower hand 14 to the non-gripping position, as illustrated in FIG. 12D. Next, Z-axis elevating drive source 8 is driven so as to lower the upper hand 13 and the lower hand 14 and place the unprocessed substrate S on the lower blade member 26 onto the lower stage of the substrate placing structure 100, as illustrated in FIG. 12E. Thereby, the substrate placing operation by the lower hand 14 is completed.

In the substrate placing operation, the upper elevating air cylinder 21 is driven so as to elevate the upper blade member 25 according to the lowering operation of the upper hand 13 and the lower hand 14 by the Z-axis elevating drive source 8. Thereby, the processed substrate S held by the upper blade member 25 does not come into contact with the upper stage of the substrate placing structure 100.

As described above using FIG. 12A to 12E, when receiving the processed substrate S and placing the unprocessed substrate S using the substrate conveying robot 1 according to the embodiment, the substrate receiving operation is executed using the Z-axis elevating drive source 8 having a servo motor. Therefore, the substrate receiving operation can be executed while minimizing impact on the processed substrate S when receiving the substrate. Therefore, the processed substrate S can be held while surely preventing the processed substrate S, to which an alignment process is applied by an aligner, from being displaced in receiving the substrate, for example.

Also, as the Z-axis elevating drive source 8 having a servo motor is used for the substrate receiving operation and the substrate placing operation, more flexible response becomes possible even when a substrate placing pitch differs for each substrate placing structure 100.

Note that, in the substrate conveying robot 1 according to the embodiment, the four pitches of the maximum pitch, the minimum pitch, the lower middle pitch, the upper middle pitch can be switched appropriately therebetween with regard to the vertical arrangement state of the upper blade member 25 and the lower blade member 26 as stated above. Therefore, it can flexibly respond to various kinds of substrate placing structures 100 with different substrate placing pitches even when the Z-axis elevating drive source 8 is not used for the substrate receiving operation and/or the substrate placing operation.

Also, when the processed substrate S is a cleaned substrate, adhesion of particles to the substrate S due to downflow for keeping cleanliness in a semiconductor manufacturing area can be prevented by always holding the processed substrate S by the upper blade member 25.

Next, a preprocess when performing the substrate receiving operation and the substrate placing operation above using the substrate conveying robot 1 according to the embodiment will be described referring to FIG. 13A to FIG. 13D. The preprocess is particularly effective for carrying-in and carrying-out of the substrate S from the substrate placing structure 100 storing a lot of substrates S such as the FOUP.

Figure 13A:
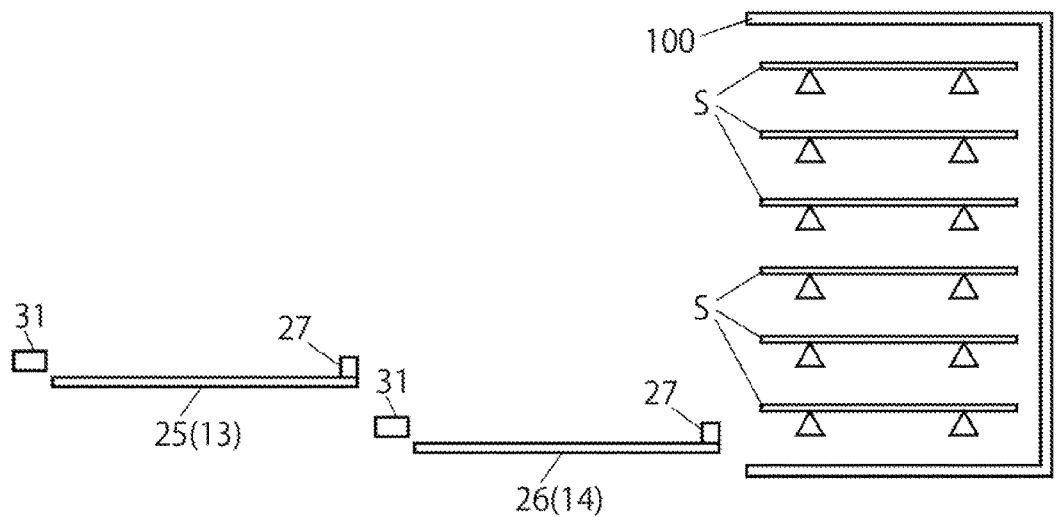
FIG. 13A is a schematic view illustrating an operation when receiving a substrate in the lowermost stage of the substrate placing structure using the substrate conveying robot illustrated in FIG. 1.
Figure 13B:
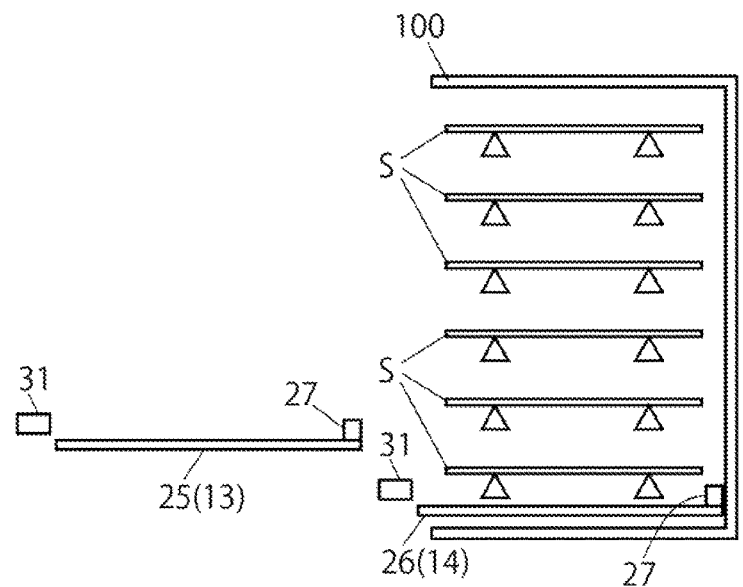
FIG. 13B is another schematic view illustrating an operation when receiving a substrate in the lowermost stage of the substrate placing structure using the substrate conveying robot illustrated in FIG. 1.

Prior to the substrate receiving operation and the substrate placing operation above, in the state that the upper hand 13 is in the non-working position as illustrated in FIG. 13A, the robot arm 4 is driven so as to advance the lower blade member 26 below the lowermost substrate S of the substrate placing structure 100, as illustrated in FIG. 13B.

Figure 13C:
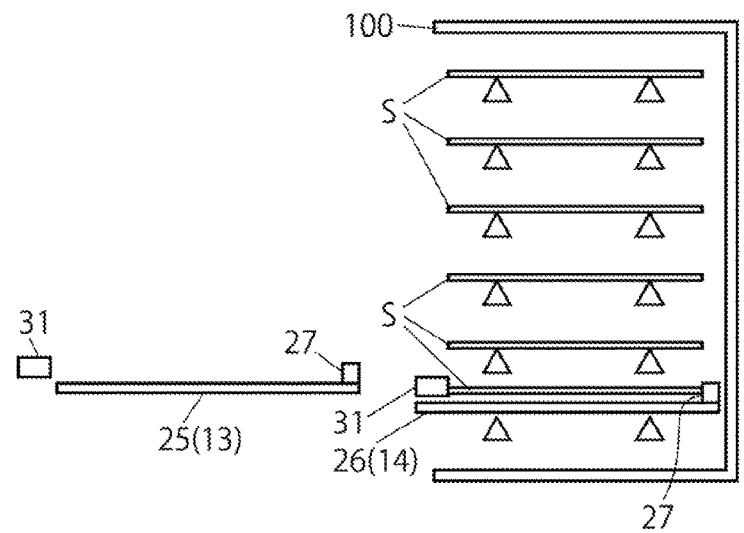
FIG. 13C is another schematic view illustrating an operation when receiving a substrate in the lowermost stage of the substrate placing structure using the substrate conveying robot illustrated in FIG. 1.
Figure 13D:
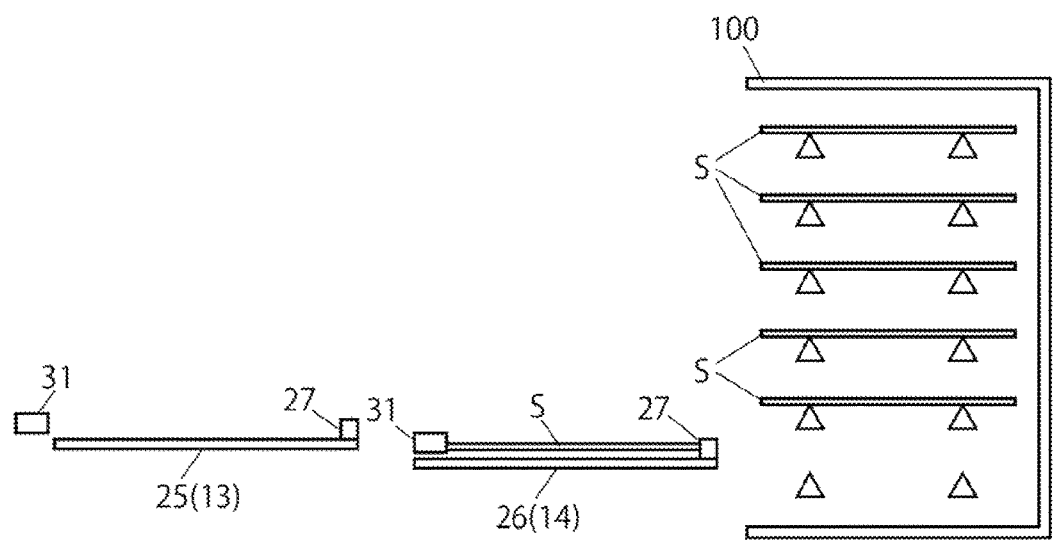
FIG. 13D is another schematic view illustrating an operation when receiving a substrate in the lowermost stage of the substrate placing structure using the substrate conveying robot illustrated in FIG. 1.

Next, as illustrated in FIG. 13C, the Z-axis elevating drive source 8 is driven so as to elevate the upper hand 13 and the lower hand 14 and receive the lowermost substrate S by the lower blade member 26 (lowermost stage substrate receiving operation). Next, the robot arm 4 is driven so as to retreat the upper blade member 25 and the lower blade member 26 and carry out the lowermost substrate S from the substrate placing structure 100 as illustrated in FIG. 13D.

Thereby, the lowermost stage of the substrate placing structure 100 becomes empty. Therefore, carrying-out of the unprocessed substrate S stored in the substrate placing structure 100 and carrying-in of the processed substrate S to the substrate placing structure 100 can be executed in order by the substrate receiving operation and the substrate placing operation above.

Note that, when there is a possibility that the processed substrate S held by the lower blade member 26 comes in contact with a back wall of the substrate placing structure 100 such as the FOUP when the upper blade member 25 and the lower blade member 26 are advanced into the substrate placing structure 100, the movable gripping portion 31 of the lower hand 14 is previously retreated to the non-gripping position.

Next, another example of the preprocess when performing the substrate receiving operation and the substrate placing operation above using the substrate conveying robot 1 according to the embodiment will be described referring to FIG. 14A to FIG. 14C.

Figure 14A:
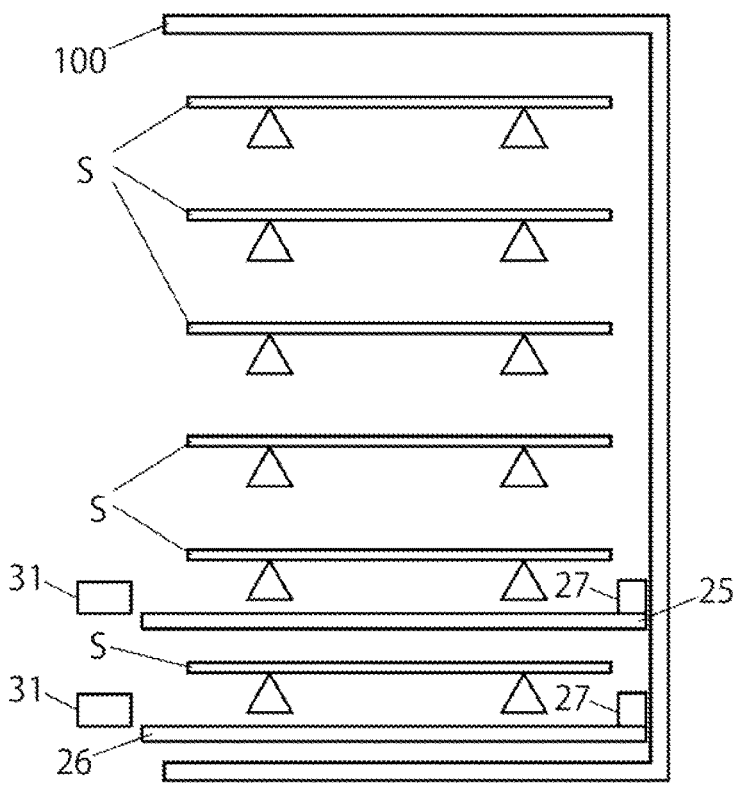
FIG. 14A is a schematic view illustrating another operation when receiving a substrate in the lowermost stage of the substrate placing structure using the substrate conveying robot illustrated in FIG. 1.
Figure 14B:
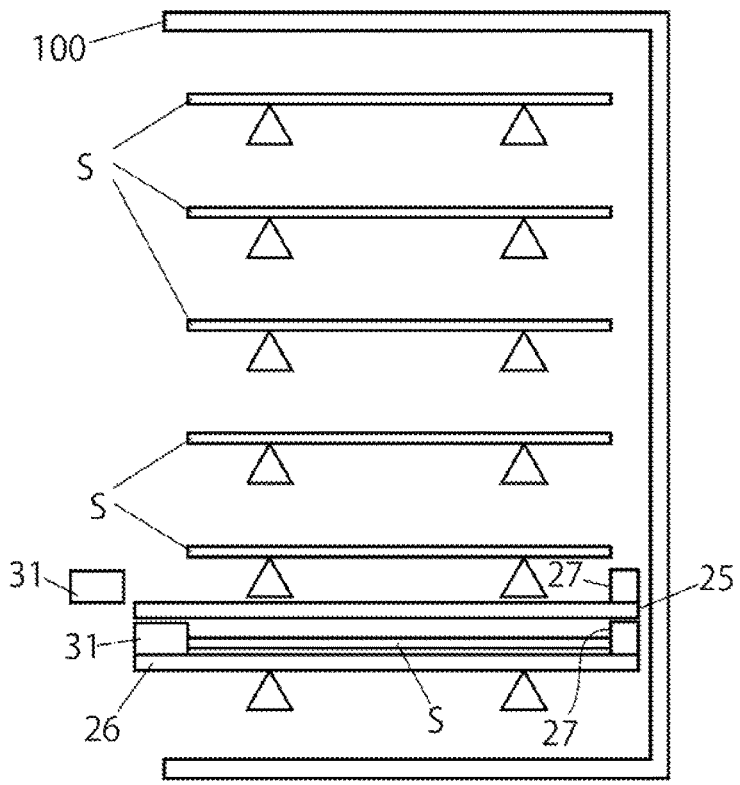
FIG. 14B is another schematic view illustrating another operation when receiving a substrate in the lowermost stage of the substrate placing structure using the substrate conveying robot illustrated in FIG. 1.
Figure 14C:
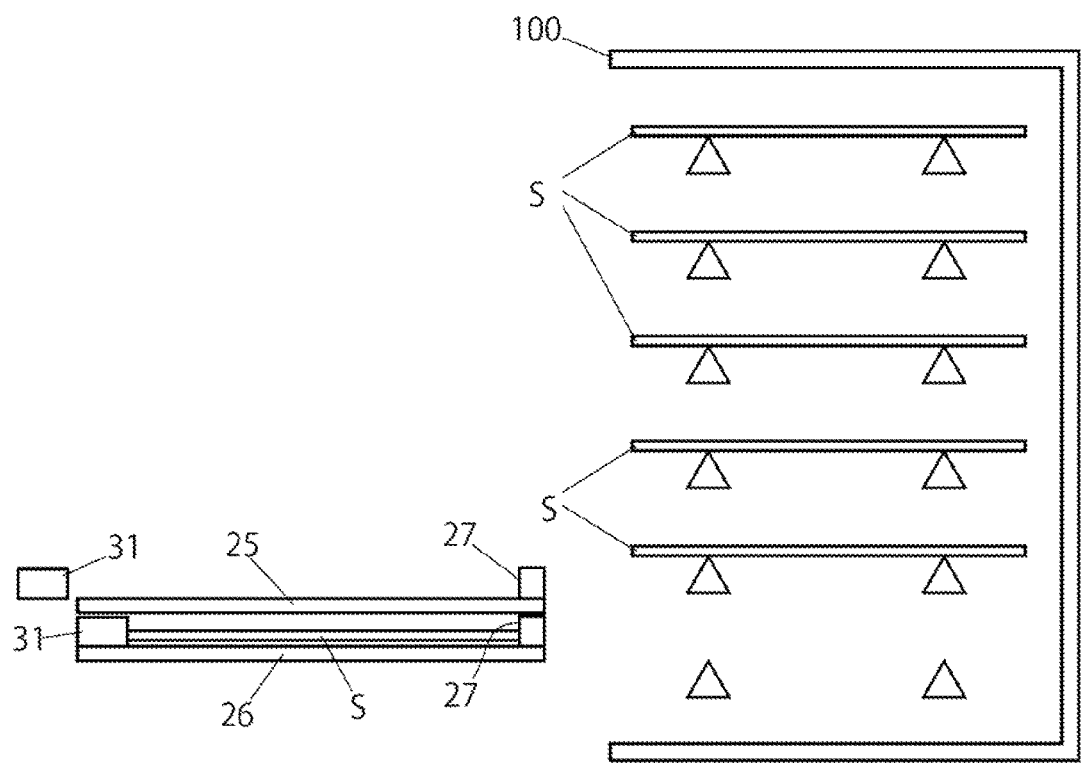
FIG. 14C is another schematic view illustrating another operation when receiving a substrate in the lowermost stage of the substrate placing structure using the substrate conveying robot illustrated in FIG. 1.

Prior to the substrate receiving operation and the substrate placing operation above, as illustrated in FIG. 14A, both the upper blade member 25 and the lower blade member 26 are made into the substrate non-holding state and the robot arm 4 is driven so as to advance the upper blade member 25 and the lower blade member 26 so that the lowermost substrate S of the substrate placing structure 100 is positioned between the upper blade member 25 and the lower blade member 26.

Next, the substrate S placed on the lowermost stage of the substrate placing structure 100 is received by the lower blade member 26 by driving the lower elevating air cylinder 22 and thereby elevating the lower blade member 26 (lowermost stage substrate receiving operation). Next, the robot arm 4 is driven so as to retreat the upper blade member 25 and the lower blade member 26 and carry out the substrate S from the substrate placing structure 100 as illustrated in FIG. 14C.

Thereby, the lowermost stage of the substrate placing structure 100 becomes empty. Therefore, carrying-out of the unprocessed substrate S stored in the substrate placing structure 100 and carrying-in of the processed substrate S to the substrate placing structure 100 can be executed in order by the substrate receiving operation and the substrate placing operation above.

Next, a modified example of the above-stated substrate conveying robot 1 will be described referring to FIG. 15.

Figure 15:
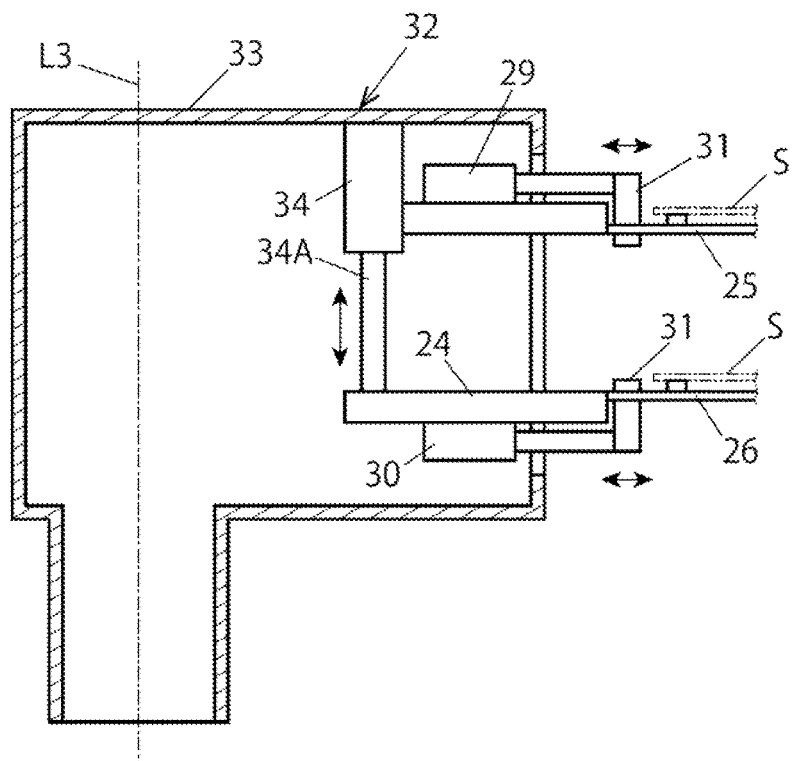
FIG. 15 is a schematic sectional view illustrating the structure of a substrate holding device of another modified example of the substrate conveying robot illustrated in FIG. 1.

The substrate conveying robot according to the modified example has a single hand 32 and the single hand 32 comprises both the upper blade member 25 and the lower blade member 26 as illustrated in FIG. 15.

A single elevating air cylinder 34 is provided inside a hand base portion 33 of the single hand 32. A piston 34A of the single elevating air cylinder 34 is arranged so as to face downward, and a lower elevating member 24 is connected to its lower end. In contrast, the upper blade member 25 is fixed to the hand base portion 32. Namely, only the lower blade member 26 is mounted so as to be elevatable on the hand base portion 33 in the modified example.

The upper blade member 25 is positioned in the opposite side to the side where the piston 34A of the elevating air cylinder 34 is positioned. Thereby, the thickness of the hand base portion 33 can be prevented from increasing even when a long air cylinder is used.

Figure 16:
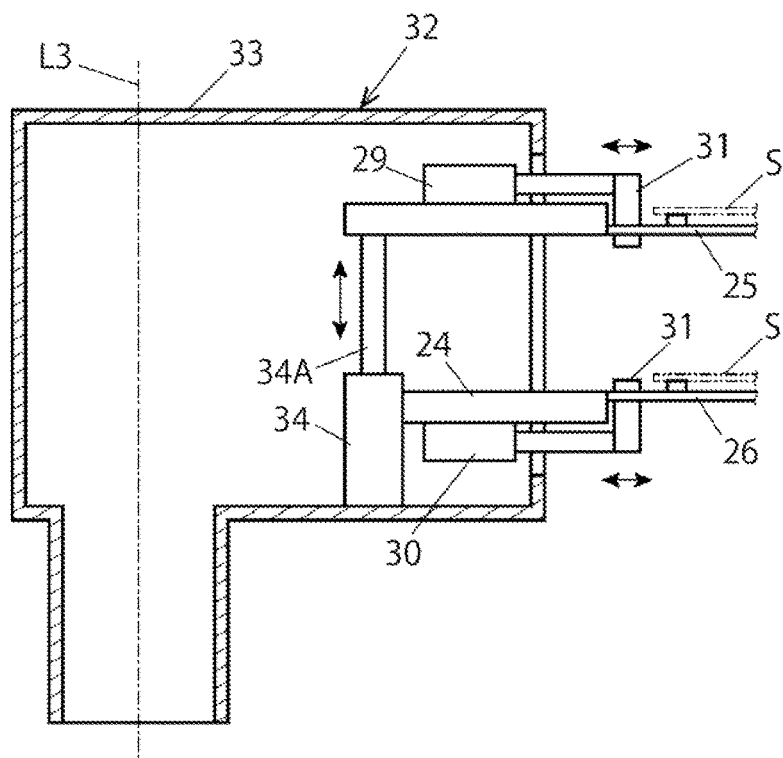
FIG. 16 is a schematic sectional view illustrating the structure of a substrate holding device of another modified example of the substrate conveying robot illustrated in FIG. 1.

FIG. 16 illustrates an example that the upper blade member 25 is made movable and the lower blade member 26 is fixed contrary to the modified example illustrated in FIG. 15. The piston 34A of the single air cylinder 34 is arranged so as to face upward. The thickness of the hand base portion 33 can be prevented from increasing even when a long air cylinder is used in the example as well.

Also in the substrate conveying robot according to each example illustrated in FIG. 15 and FIG. 16, the substrate receiving operation and the substrate placing operation above can be executed by using the Z-axis elevating drive source 8.

Next, another modified example of the above-stated substrate conveying robot 1 will be described referring to FIG. 17.

In the substrate conveying robot according to the modified example, the upper hand 13 is the same as in the substrate conveying robot 1 illustrated in FIG. 1. In contrast, with regard to the lower hand 14, the lower elevating air cylinder 22 is not provided and the lower blade member 26 is fixed to the hand base portion 20.

Also in the substrate conveying robot according to the embodiment, the substrate receiving operation and the substrate placing operation above can be executed by using the Z-axis elevating drive source 8.

Next, another modified example of the above-stated substrate conveying robot 1 will be described referring to FIG. 18 to FIG. 20B.

Figure 17:
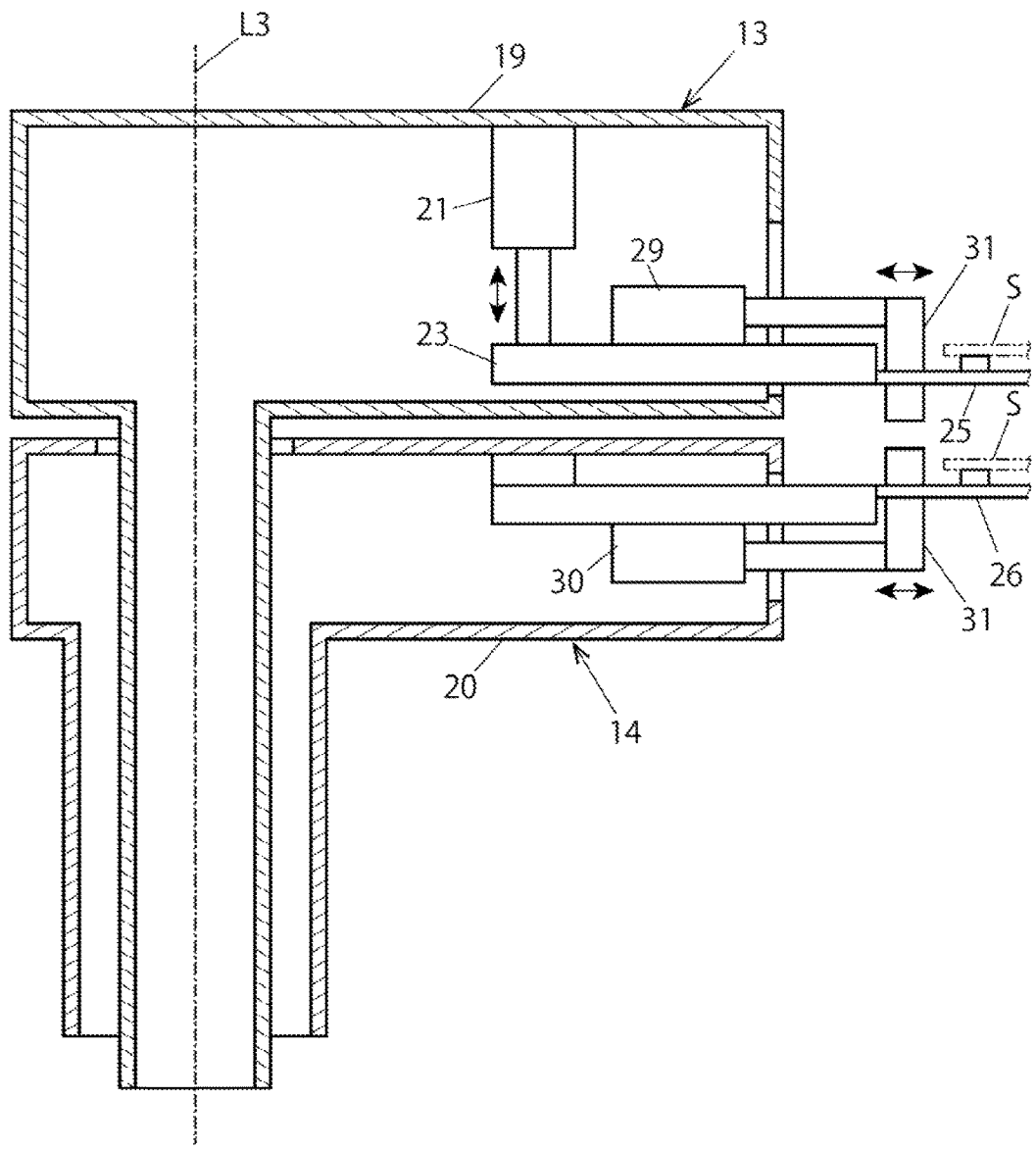
FIG. 17 is a schematic sectional view illustrating the structure of a substrate holding device of another modified example of the substrate conveying robot illustrated in FIG. 1.

The substrate conveying robot according to the modified example is that, in the substrate conveying robot illustrated in FIG. 17, a substrate detection unit 35 is provided to the upper hand 13. The substrate detection unit 35 has a substrate sensor 36 provided on the distal end portion of the movable upper blade member 25 and a sensor amplifier 37 connected to the substrate sensor 36. The substrate sensor 36 can be configured by a transmission type optical sensor or a reflection type optical sensor, for example.

By the substrate conveying robot according the modified example, a proximal edge portion of the single substrate S can be detected by the substrate sensor 36 by driving the upper elevating air cylinder 21, thereby moving the upper blade member 26 in the vertical direction. Accordingly, even when the robot arm 4 itself cannot be operated to be elevated in the state that the robot arm 4 is inserted into a narrow opening portion 101, the upper blade member 25 can detect the presence and absence of the single substrate S by the elevating operation of the upper blade member 25.

Figure 18:
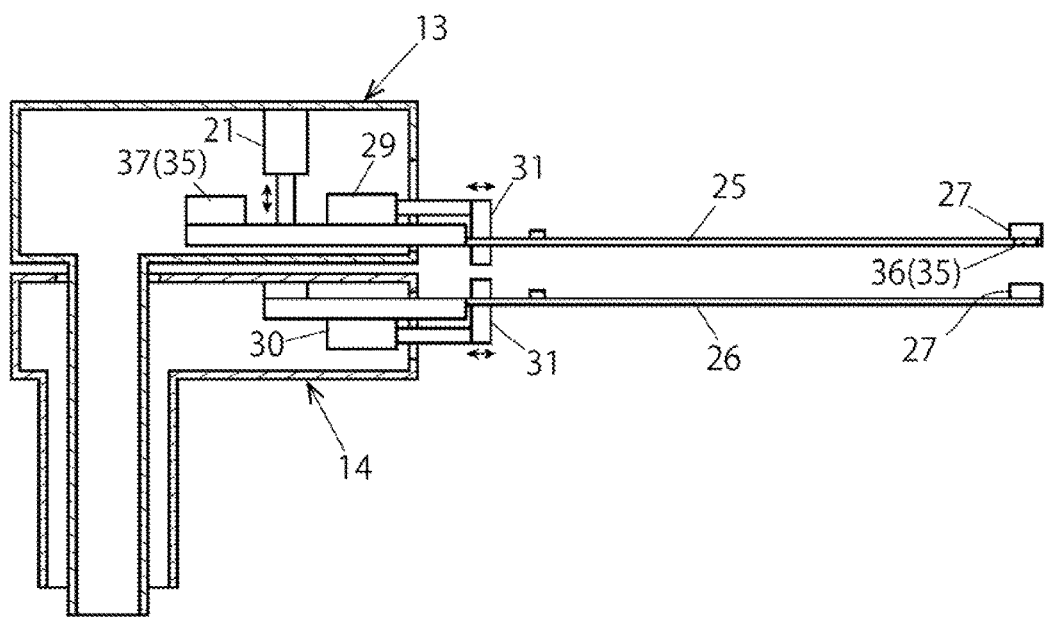
FIG. 18 is a schematic sectional view illustrating a substrate holding device and a substrate detection unit of another modified example of the substrate conveying robot illustrated in FIG. 1.
Figure 19:
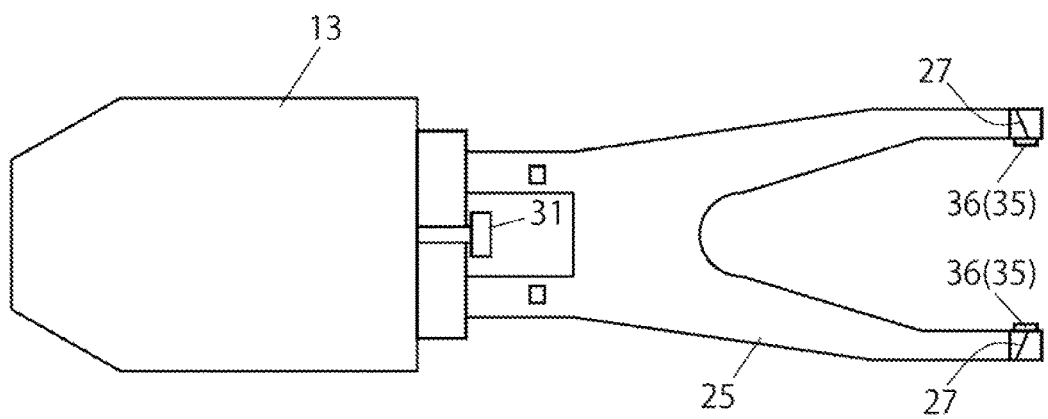
FIG. 19 is a schematic plan view illustrating the substrate holding device and the substrate detection unit of the substrate conveying robot illustrated in FIG. 18.
Figure 20A:
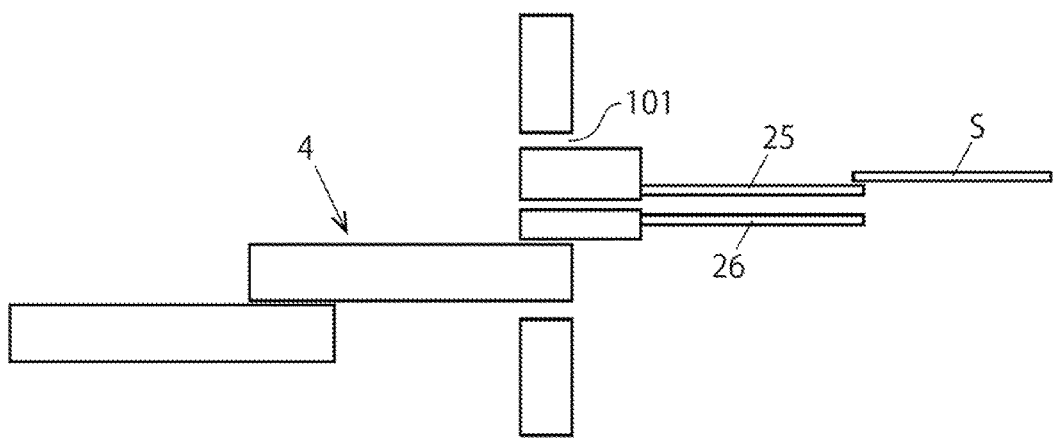
FIG. 20A is a schematic sectional view illustrating an operation when detecting a single substrate using the substrate conveying robot illustrated in FIG. 18 and FIG. 19.
Figure 20B:
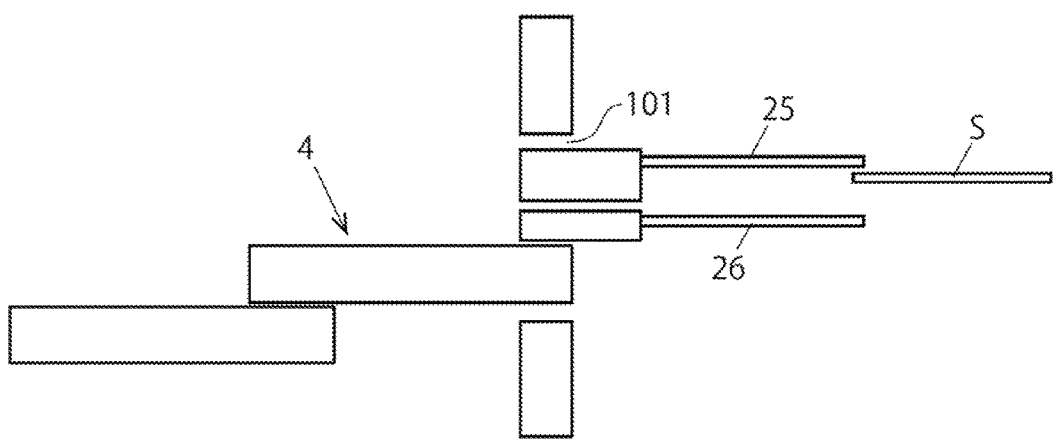
FIG. 20B is another schematic sectional view illustrating an operation when detecting a single substrate using the substrate conveying robot illustrated in FIG. 18 and FIG. 19.
Figure 21:
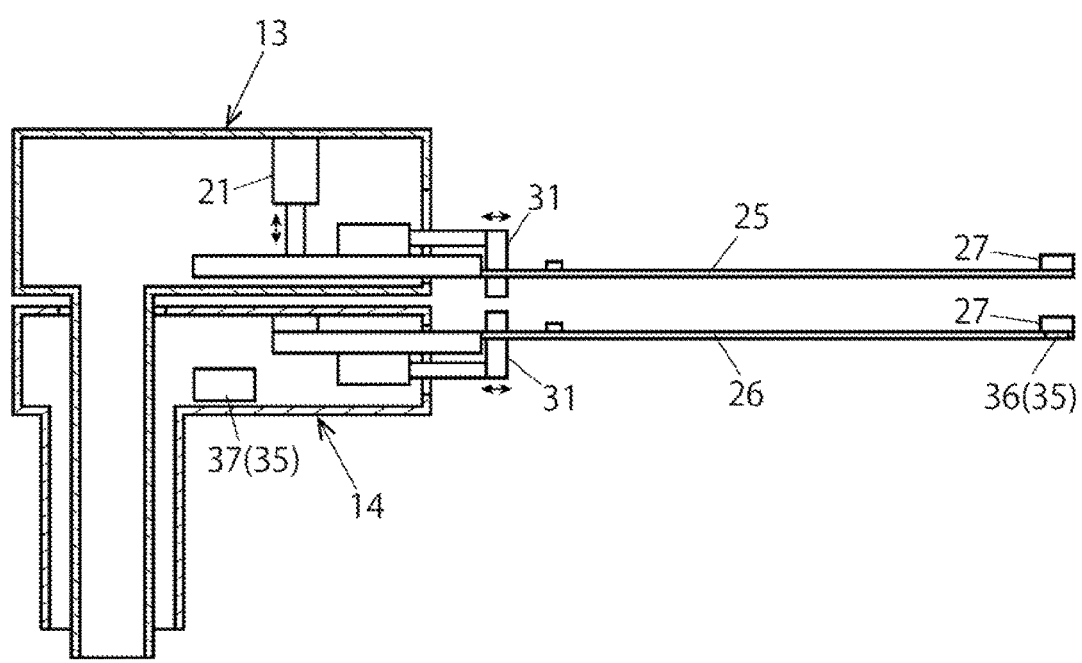
FIG. 21 is a schematic sectional view illustrating the substrate holding device and the substrate detection unit of another modified example of the substrate conveying robot illustrated in FIG. 1.
Figure 22A:
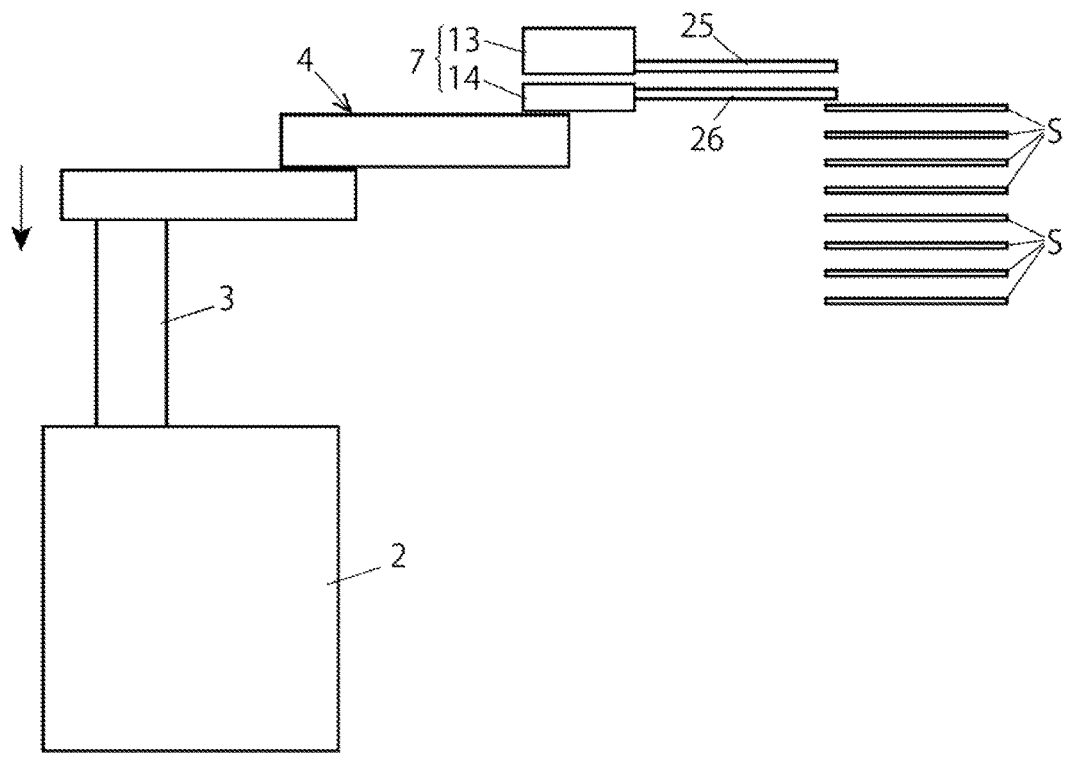
FIG. 22A is a schematic sectional view illustrating an operation when detecting a plurality of substrates using the substrate conveying robot illustrated in FIG. 21.
Figure 22B:
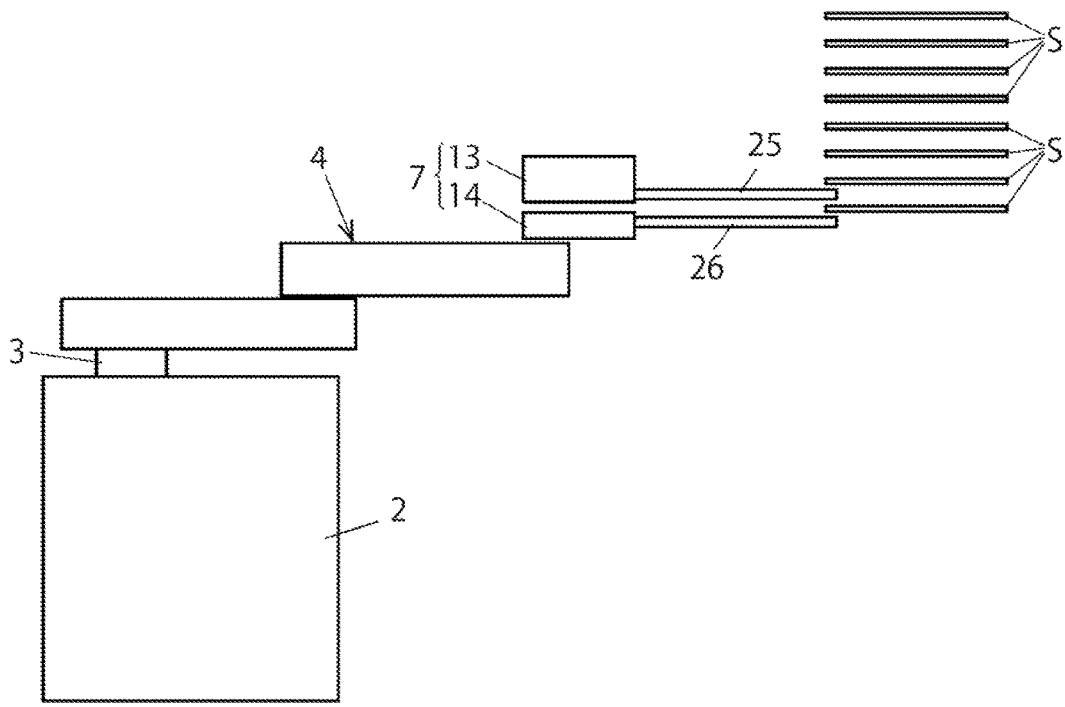
FIG. 22B is another schematic sectional view illustrating an operation when detecting a plurality of substrates using the substrate conveying robot illustrated in FIG. 21.

FIG. 21 illustrates an example that the substrate detection unit 35 is provided to the lower hand 14 having the fixed lower blade member 26, contrary to the example in illustrated FIG. 18. In the example, as illustrated in FIG. 22A and FIG. 22B, the presence and absence of a plurality of substrates S placed in the substrate placing structure 100 can be detected (capable of mapping) by elevating the lower blade member 26 by the Z-axis elevating drive source 8.

By providing the substrate sensor 36 to the fixed lower blade member 26, an optical fiber between the substrate sensor 36 and the sensor amplifier 37 can be handled easily and also the light quantity (detection precision) can be stabilized.

Figure 23:
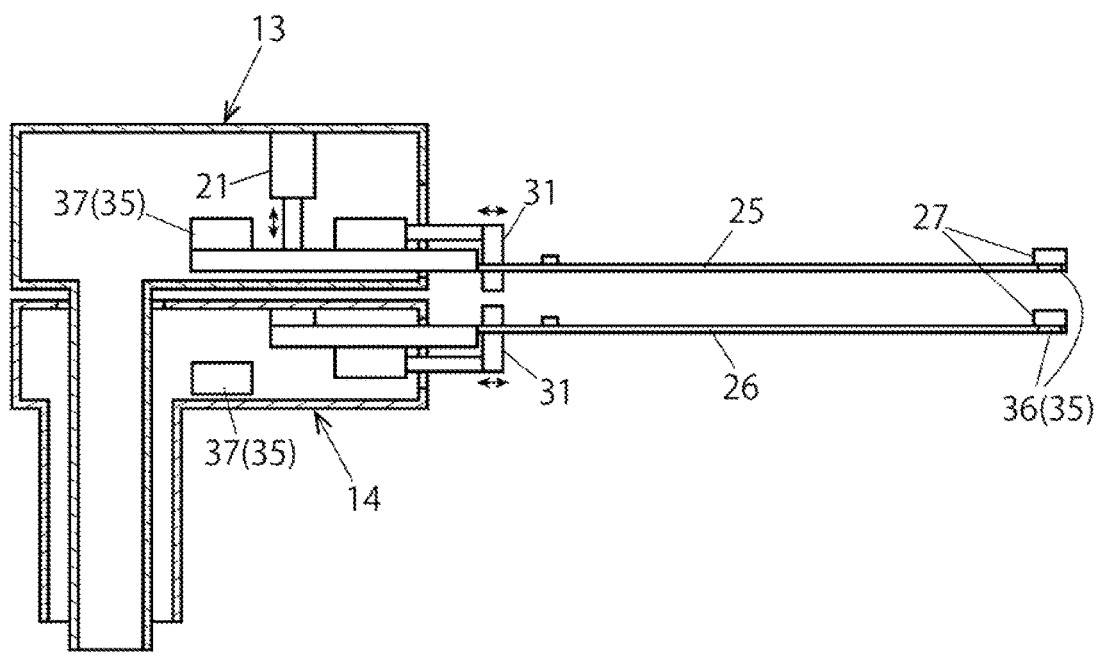
FIG. 23 is a schematic sectional view illustrating the substrate holding device and the substrate detection unit of another modified example of the substrate conveying robot illustrated in FIG. 1.

FIG. 23 illustrates an example that the substrate detection unit 35 is provided to the both the upper hand 13 and the lower hand 14. In the example, both the detection of the single substrate S in the example in FIG. 18 and the detection of a plurality of substrates S in the example in FIG. 21 can be executed.

Note that, also in the example illustrated in FIG. 18, a plurality of substrates S can be detected using the substrate sensor 36 provided to the movable upper blade member 25 by driving the Z-axis elevating drive source 8.

Figure 24:
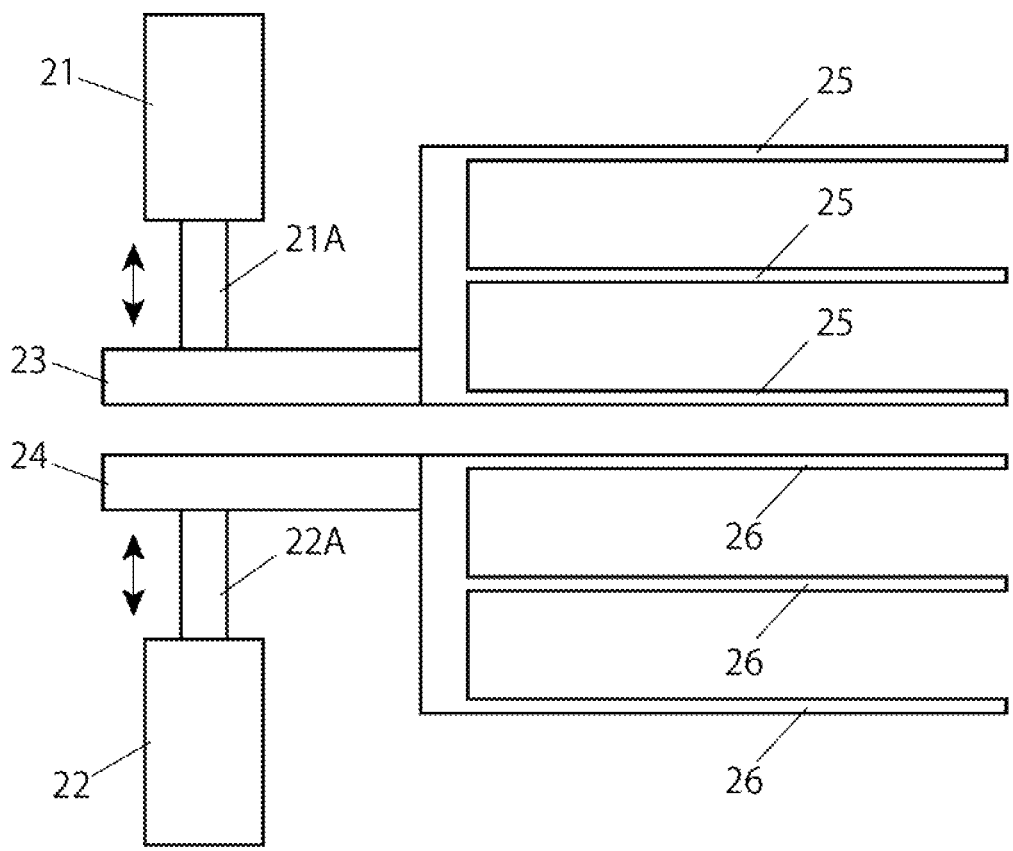
FIG. 24 is a schematic sectional view illustrating the substrate holding device of another modified example of the substrate conveying robot illustrated in FIG. 1.

Next, the substrate conveying robot according to another modified example of the above-stated embodiment will be described referring to FIG. 24 to FIG. 25E.

In the substrate conveying robot according to the example, a plurality of (three in the example) upper blade members 25 whose vertical intervals are mutually fixed are connected to the upper elevating member 23 of the upper hand 13. Similarly, a plurality of (three in the example) lower blade members 26 whose vertical intervals are mutually fixed are connected to the lower elevating member 24 of the lower hand 14 as well.

Figure 25A:
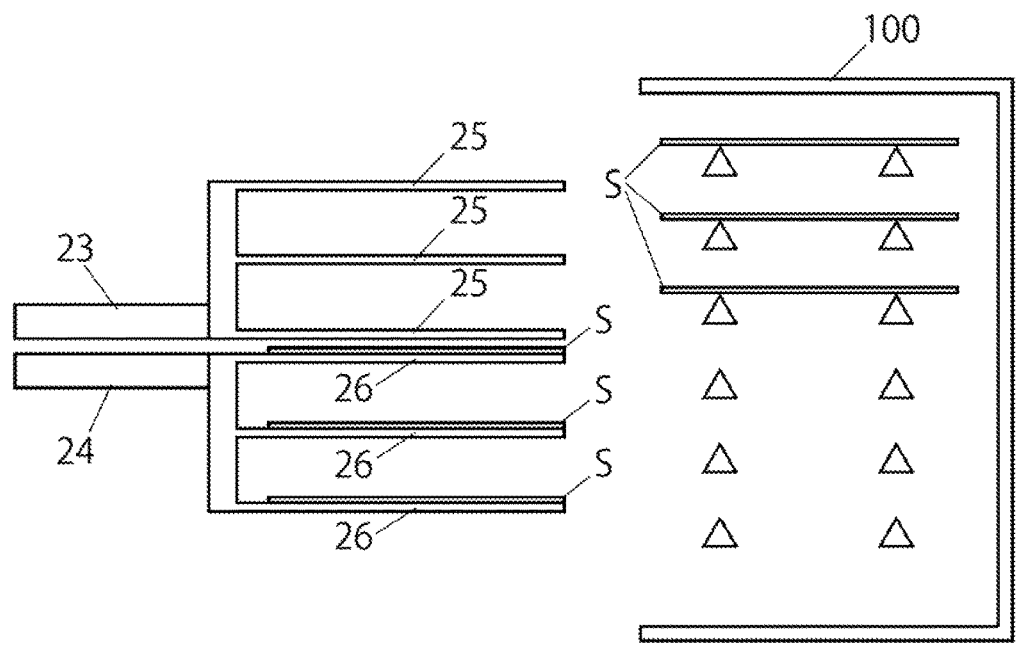
FIG. 25A is a schematic view illustrating an operation when receiving a processed substrate and placing an unprocessed substrate using the substrate conveying robot illustrated in FIG. 24.
Figure 25B:
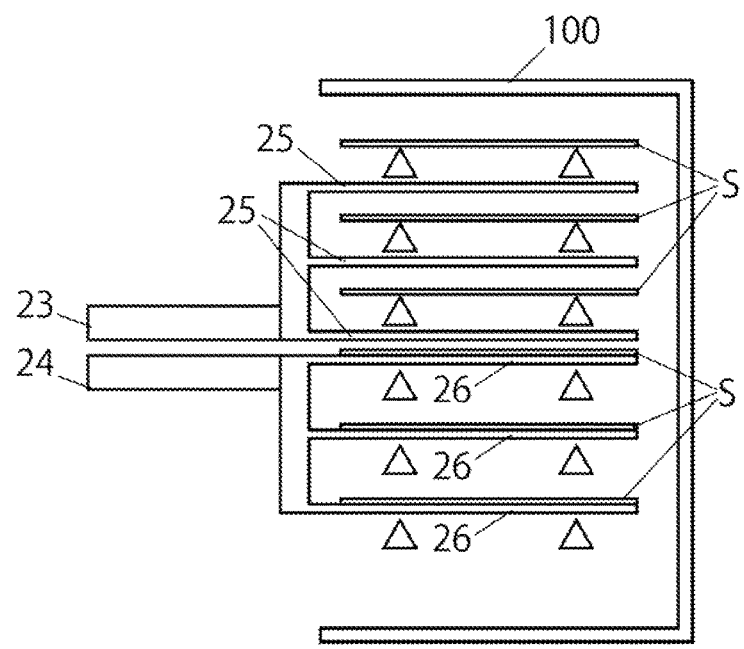
FIG. 25B is another schematic view illustrating an operation when receiving a processed substrate and placing an unprocessed substrate using the substrate conveying robot illustrated in FIG. 24.

When the processed substrate S is carried into the substrate placing structure 100 and the unprocessed substrate S is carried out from the substrate placing structure 100 using the substrate conveying robot according to the example, first, the robot arm 4 is driven in the state that a plurality of processed substrates S are held by a plurality of lower blade members 26 as illustrated in FIG. 25A so as to advance a plurality of lower blades 26 and a plurality of upper blades 25 and make them enter the substrate placing structure 100 as illustrated in FIG. 25B.

Figure 25C:
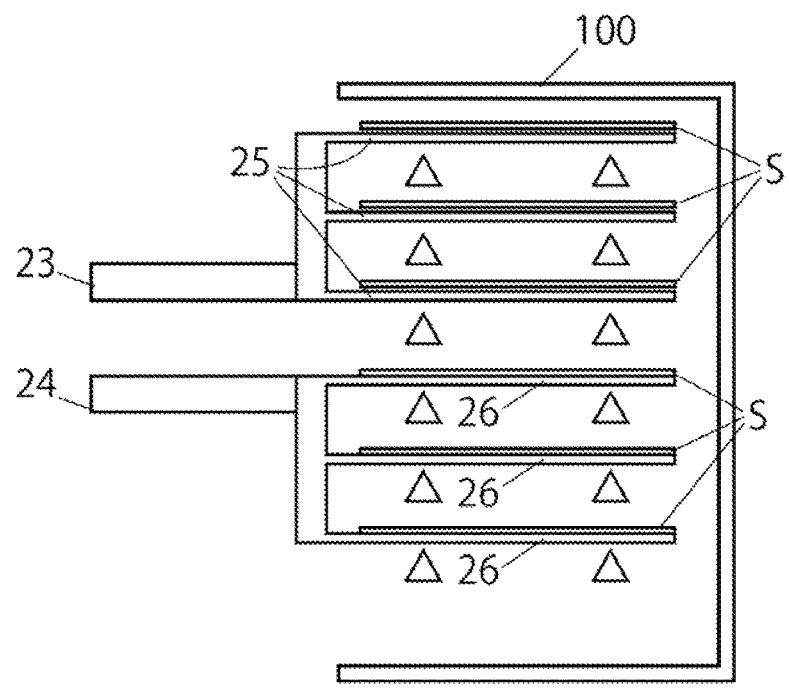
FIG. 25C is another schematic view illustrating an operation when receiving a processed substrate and placing an unprocessed substrate using the substrate conveying robot illustrated in FIG. 24.
Figure 25D:
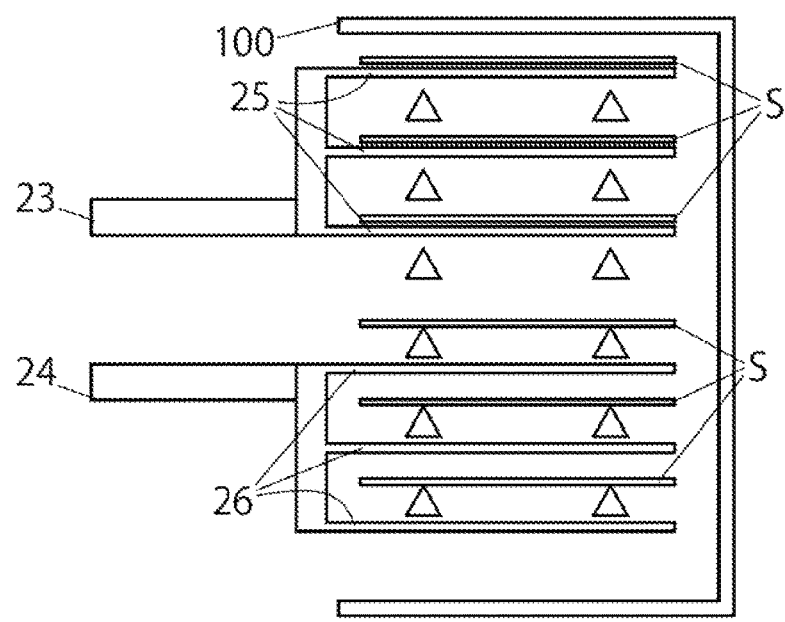
FIG. 25D is another schematic view illustrating an operation when receiving a processed substrate and placing an unprocessed substrate using the substrate conveying robot illustrated in FIG. 24.
Figure 25E:
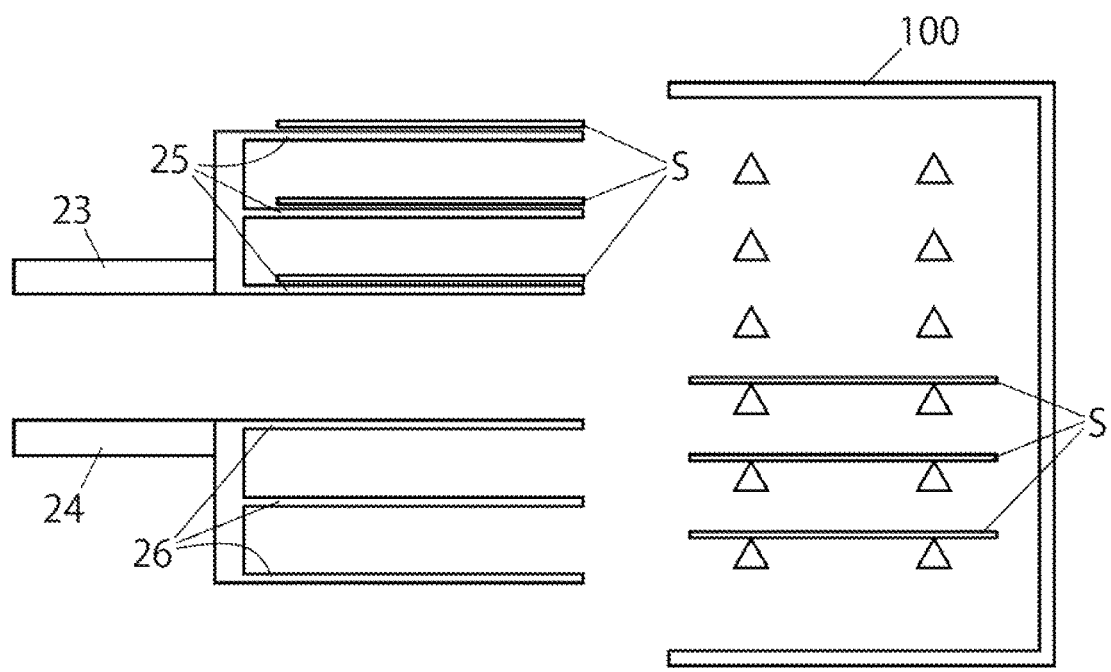
FIG. 25E is another schematic view illustrating an operation when receiving a processed substrate and placing an unprocessed substrate using the substrate conveying robot illustrated in FIG. 24.

Next, as illustrated in FIG. 25C, the upper elevating air cylinder 21 is driven so as to elevate a plurality of upper blade members 25 and hold a plurality of unprocessed substrates S by a plurality of upper blade members 25. Subsequently, the lower elevating air cylinder 22 is driven so as to lower a plurality of lower blade members 26 and place a plurality of processed substrates S in the substrate placing structure 100 by a plurality of lower blade members 26, as illustrated in FIG. 25D. Next, the robot arm 4 is driven so as to retreat a plurality of upper blade members 25 and a plurality of lower blade members 26 and carry out a plurality of unprocessed substrates S from the substrate placing structure 100, as illustrated in FIG. 25E.

In the example, a plurality of processed substrates S can be carried into the substrate placing structure 100 at the same time and a plurality of unprocessed substrates S can be carried out from the substrate placing structure 100 at the same time, and therefore the tact time in conveying substrates can be further shortened.

Note that, it is usually preferable that the installation number of upper blade members 25 and the installation number of lower blade members 26 are the same, both the installation numbers may be different from each other in accordance with purposes of use.

Figure 26:
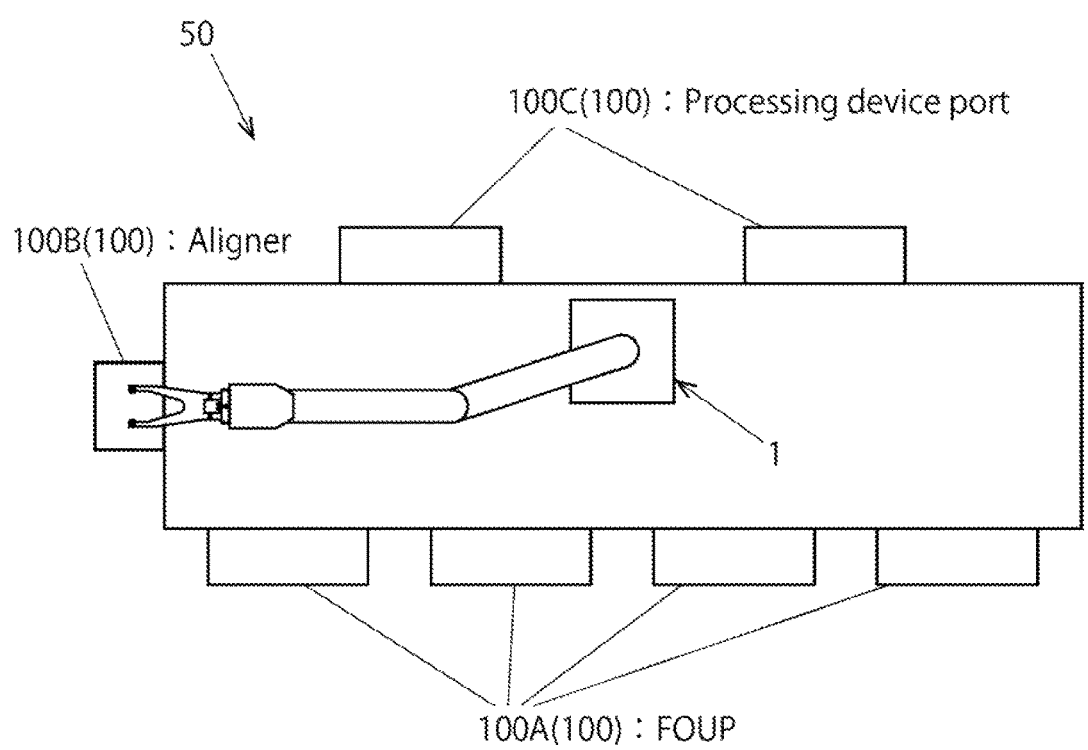
FIG. 26 is a schematic plan view illustrating a substrate processing system provided with the substrate conveying robot illustrated in FIG. 1 and different kinds of substrate placing structures.

Next, a substrate processing system provided with the substrate conveying robot 1 according to the embodiment or each modified example above and a plurality of different kinds of substrate placing structures 100 will be described referring to FIG. 26.

The substrate processing system 50 comprises a FOUP 100A, an aligner 100B, and a processing device port 100C as the substrate placing structures 100. In the embodiment, the substrate placing pitches in these substrate placing structures 100 are set to the same. Here, the aligner 100B has a placing portion (not illustrated) for temporarily placing the substrate S other than a placing portion for rotating the substrate (wafer) S.

Thus, in the embodiment, the substrate placing pitches of a plurality of kinds of substrate placing structures 100 are set to the same. Therefore, the relative moving distance of the upper blade member 25 and the lower blade member 26 in the vertical direction can be minimized.

Note that, although the case when the processed substrate S is received from the upper stage of the substrate placing structure 100 and the unprocessed substrate S is placed on the lower stage of the substrate placing structure 100 is described in the embodiment and each modified example above, on the contrary, the processed substrate may be received from the lower stage of the substrate placing structure 100 and the unprocessed substrate may be placed on the upper stage of the substrate placing structure 100.

In this case, the vertical interval between the upper blade member 25 and the lower blade member 26 is made maximum (full pitch), and the upper blade member 25 in the substrate holding state is advanced above the upper stage of the substrate placing structure 100 and the lower blade member 26 in the substrate non-holding state is advanced below the lower stage of the substrate placing structure 100. Then, the substrate S is placed on the upper stage of the substrate placing structure 100 by the lowering operation of the upper blade member 25 and the substrate S is received from the lower stage of the substrate placing structure 100 by the elevating operation of the lower blade member 26.

Also, when the processed substrate S received from the first substrate placing structure 100 is placed in the second substrate placing structure 100, the processed substrate S may be placed in the second substrate placing structure 100 and the new unprocessed substrate S may be received according to the operation opposite to the substrate receiving operation/substrate placing operation in the first substrate placing structure 100.

For example, when the substrate receiving operation/substrate placing operation is executed by expanding the vertical interval between the upper blade member 25 and the lower blade member 26 in the first substrate placing structure 100, the substrate receiving operation/substrate placing operation may be executed by reducing the vertical interval between the upper blade member 25 and the lower blade member 26 in the second substrate placing structure 100.

Figure 27:
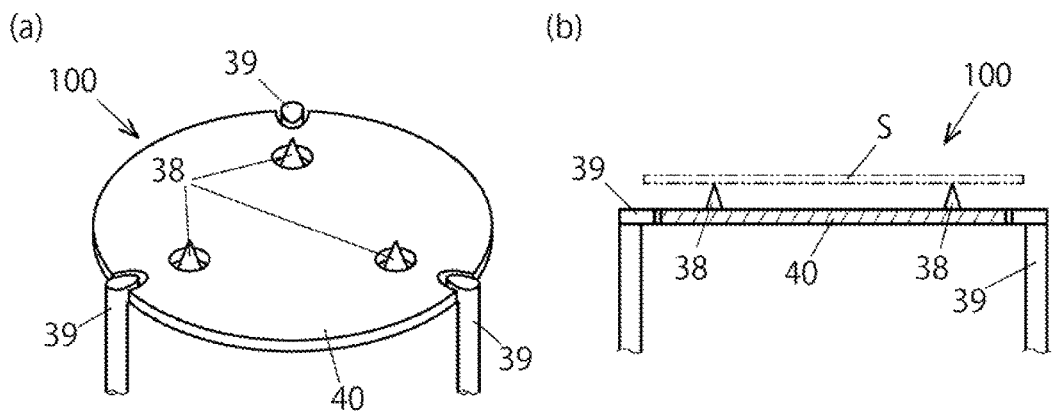
FIG. 27 is a view schematically illustrating an example of the configuration whose processing device stage can be switched into the substrate placing structure consisting of upper and lower stages in the state that the upper stage is lowered, (a) is a perspective view, and (b) is a side view.
Figure 28:
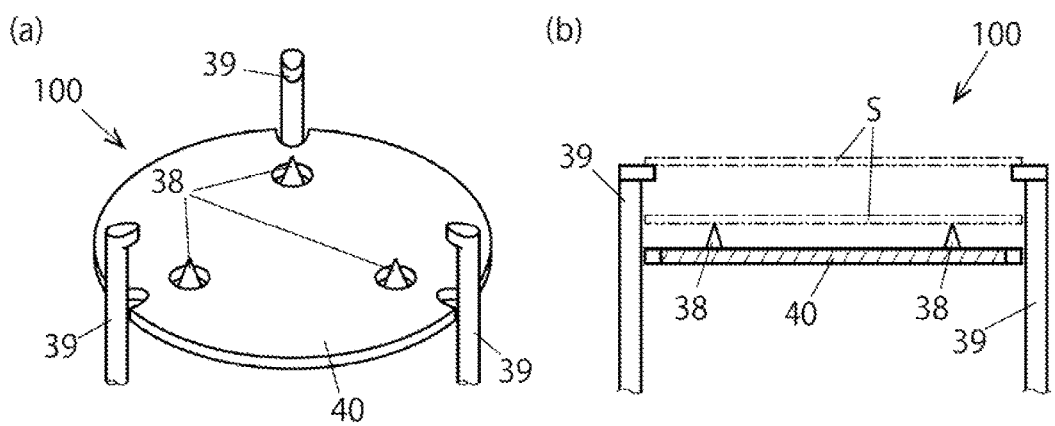
FIG. 28 is a schematic view illustrating the substrate placing structure illustrated in FIG. 27 in the state that the upper stage is elevated, (a) is a perspective view, and (b) is a side view.

FIG. 27 (a), (b) and FIG. 28 (a), (b) illustrate an example of the configuration that a stage 40 of the processing device can be switched into the substrate placing structure 100 consisting of upper and lower stages. Although a turntable in the resist application process and a hotplate in the thermal processing step can be employed as a stage, the configuration can be broadly applied to the substrate placing structure which is not consisting of the upper and lower stages, not limiting to them.

The substrate placing structure 100 has three lower stage movable pins 38 configuring the lower stage and three upper stage movable pins 39 configuring the upper stage. The upper stage movable pin 39 can be switched between the state that it retracted to the same height as the substrate placing surface of the stage 40 or lower than the height as illustrated in FIG. 27 (a), (b) and the state that it is lifted upward as illustrated in FIG. 28 (a), (b). The lower movable pin 38 can also be retracted to the same height as the substrate placing surface of the stage 40 or lower than the height.

In the state that the lower stage movable pin 38 and the upper stage movable pin 39 are lifted, the substrate S can be placed on each of the lower stage movable pin 38 and the upper stage movable pin 39.

Also, the upper stage movable pin 39 can switch the substrate supporting piece provided on the upper end of the pin between the radially inward direction and the radially outward direction by rotating about its longitudinal axis. Thereby, from the state in FIG. 28 (a), the substrate supporting piece provided on the upper end of the upper stage movable pin 39 can be lowered to the retracting position illustrated in FIG. 27 (a) while permitting it to avoid the substrate S placed on the stage 40 of the lower stage movable pin 38. On the contrary, the substrate supporting piece provided on the upper end of the upper stage movable pin 39 can be lifted to the state illustrated in FIG. 28 (a) while permitting it to avoid the substrate S placed on the lower movable pin 38 from the retracting position illustrated in FIG. 27(a).

Figure 29:
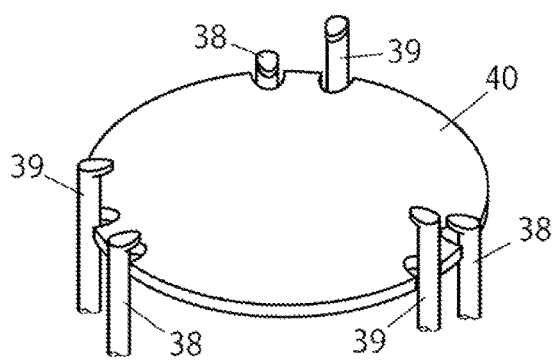
FIG. 29 is a perspective view illustrating another example of the configuration whose processing device stage can be switched into the substrate placing structure consisting of upper and lower stages in the state that the upper stage is elevated.

FIG. 29 illustrates another example of the configuration capable of switching the stage 40 of the processing device into the substrate placing structure 100 consisting of upper and lower stages. In the example, the three lower stage movable pins 38 and the three upper stage movable pins 39 are arranged on the same circumference. Also in the example, the same function as the example illustrated in FIG. 27(a), (b) and FIG. 28(a), (b) can be achieved by driving or rotationally driving the upper stage movable pin 39 to be elevated.

Figure 30:
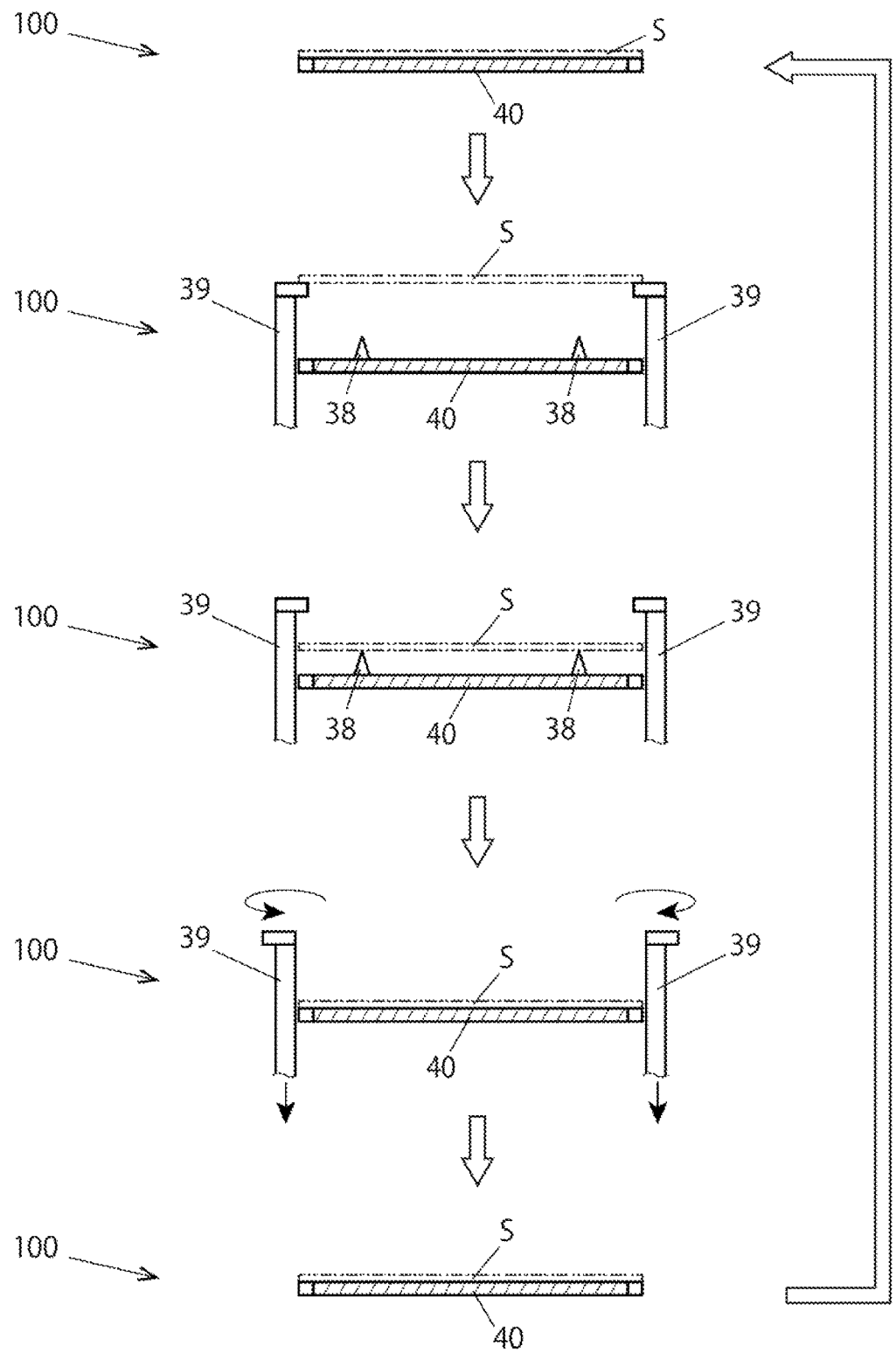
FIG. 30 is a view illustrating an operation when receiving a processed substrate and placing an unprocessed substrate using the substrate conveying robot illustrated in FIG. 1 in the substrate placing structure in FIG. 27 and FIG. 28.

FIG. 30 illustrates an operation when the processed substrate S is received and the unprocessed substrate S is placed using the substrate conveying robot 1 illustrated in FIG. 1 in the substrate placing structure 100 in FIG. 27 and FIG. 28.

Figure 31:
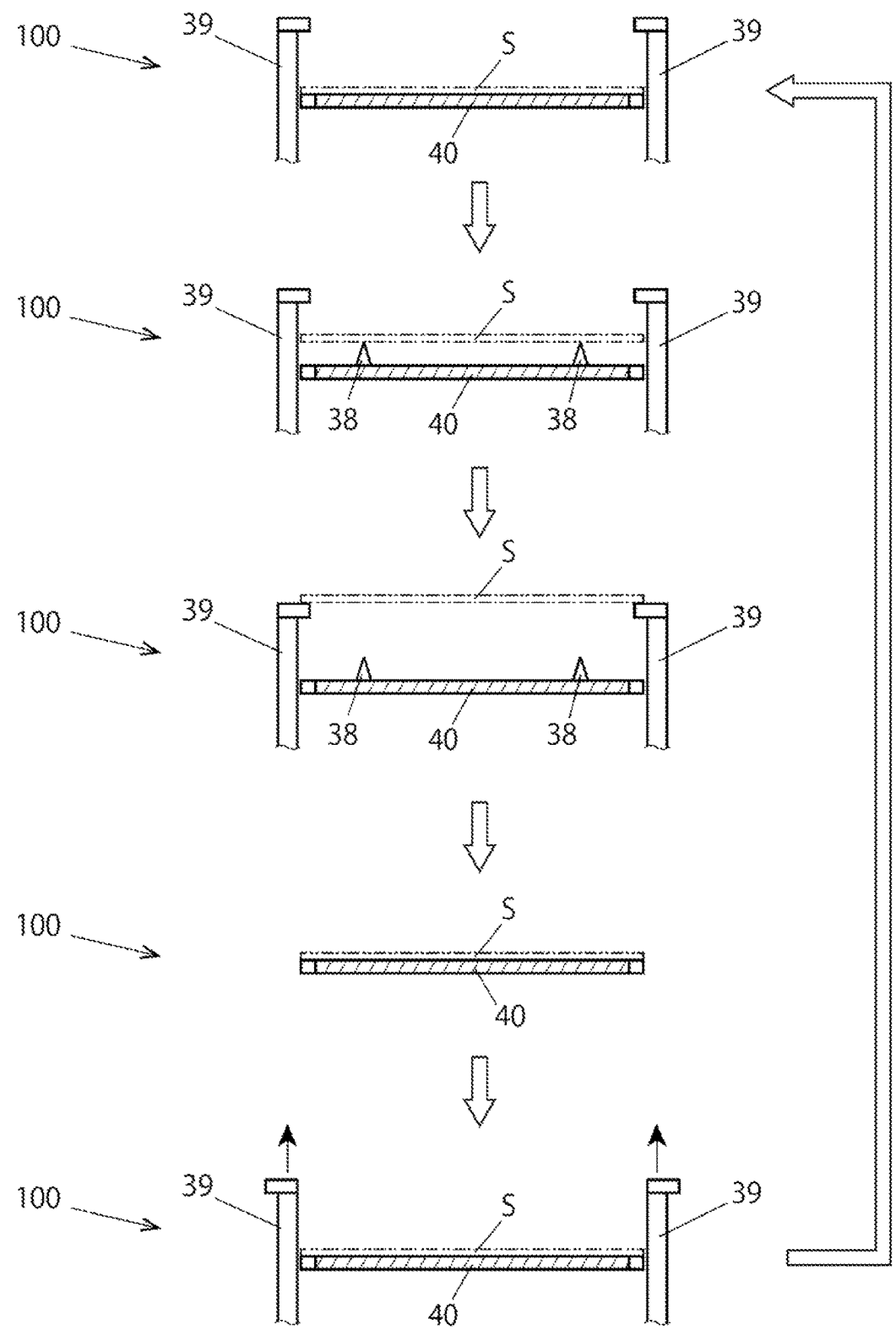
FIG. 31 is a view illustrating an operation when receiving a processed substrate and placing an unprocessed substrate using the substrate conveying robot illustrated in FIG. 1 in the substrate placing structure in FIG. 27 and FIG. 28.

FIG. 31 illustrates another operation when the processed substrate S is received and the unprocessed substrate S is placed using the substrate conveying robot 1 illustrated in FIG. 1 in the substrate placing structure 100 in FIG. 27 and FIG. 28.

As illustrated in FIG. 30 and FIG. 31, the processed substrate S and the unprocessed substrate S can be replaced with each other quickly using the substrate conveying robot 1 by lifting the processed substrates S by the upper movable pin 39 or the lower movable pin 38 thereby putting them in the upper and lower stages.

Note that, when one blade member is vertically driven by an air cylinder or the like and the other blade member is driven by a Z-axis motor, the drive speed of the Z-axis motor may be adjusted based on the operation speed of the air cylinder which has been detected. For example, the drive speed of the Z-axis motor may be controlled in accordance with the operation speed of the air cylinder so as to perform "taking" and "placing" of wafers at the same time. At this time, some alarm may be generated when the operation speed of the air cylinder is higher/lower than a predetermined value.

Also, as a mechanism for holding a substrate in the substrate holding device in the present invention, various substrate holding mechanisms such as a vacuum hand, a placing hand, a drop type hand can be applied, excluding an aspect which requires the edge grip mechanism.

DESCRIPTION OF REFERENCE NUMERALS 1 substrate conveying robot
2 base
3 rotary main shaft
4 robot arm
5 first link member
6 second link member
7 substrate holding device
8 Z-axis elevating drive source (Z-axis elevating unit)
9 turning drive source
10 drive source for rotational operation of second link member
11 drive source for rotational operation of substrate holding device
12 robot controller (control unit)
13 upper hand
14 lower hand
15 inner wrist shaft
16 outer wrist shaft
17, 18 wrist shaft drive source
19 upper hand base portion
20 lower hand base portion
21 upper elevating air cylinder
22 lower elevating air cylinder
23 upper elevating member
24 lower elevating member
25 upper blade member
26 lower blade member
27 fixed gripping portion
28 bottom surface supporting portion
29 upper pressing air cylinder
30 lower pressing air cylinder
31 movable gripping portion
32 single hand
33 hand base portion of single hand
34 single elevating air cylinder
35 substrate detection unit
36 substrate sensor
37 sensor amplifier
38 lower stage movable pin
39 upper stage movable pin
40 stage of processing device
50 substrate processing system
100 substrate placing structure
100A FOUP
100B aligner
100C processing device port
S substrate (wafer)

The invention claimed is:

1. A substrate conveying robot for holding and conveying a substrate, comprising:
a robot arm;
a substrate holding device mounted on the robot arm; and
a controller configured to control the robot arm and the substrate holding device,
wherein the substrate holding device has a plurality of hands, one of the hands having one blade member configured to hold one substrate, an other of the hands having an other blade member configured to hold an other substrate, the one blade member and the other blade member being arranged in a vertical direction,
wherein the substrate holding device further has a blade elevating unit disposed inside the one of the hands and configured to move only the one blade member in the vertical direction with respect to the other blade member,
wherein the controller is configured to make the robot arm and the substrate holding device execute, in a state that one of the one blade member and the other blade member is made into a substrate holding state and an other of the one blade member and the other blade member is made into a substrate non-holding state, a blade member advancing operation of advancing the one blade member and the other blade member into a substrate placing structure having an upper stage and a lower stage, a substrate receiving operation of receiving a substrate placed on one of the upper stage and the lower stage by the blade member in the substrate non-holding state, and a substrate placing operation of placing the substrate of the blade member in the substrate holding state on an other of the upper stage and the lower stage,
wherein the substrate holding device is configured to be capable of being switched between a first working state that the one blade member and the other blade member are arranged in the vertical direction and a second working state that the one blade member and the other blade member are arranged in a position out of the vertical direction and a single blade member is configured to advance into the substrate placing structure, and
wherein the one blade member and the other blade member have a common rotational axis and are configured to be independently rotated about the common rotational axis relative to each other.

2. The substrate conveying robot according to claim 1, wherein the controller makes the substrate holding device into the second working state prior to the blade member advancing operation, the substrate receiving operation, and the substrate placing operation, and advances one of the one blade member and the other blade member below a substrate placed on a lowermost stage of the substrate placing structure and elevates the one of the one blade member and the other blade member so as to make the robot arm and the substrate holding device execute a lowermost stage substrate receiving operation of receiving the substrate placed on the lowermost stage.

3. The substrate conveying robot according to claim 1, wherein a vertical interval of the one blade member and the other blade member is configured to be made into 12 mm or less by the blade elevating unit.

4. The substrate conveying robot according to claim 1, further comprising a Z-axis elevating unit having a servo motor capable of simultaneously elevating the plurality of hands,
wherein the substrate receiving operation is executed by using the Z-axis elevating unit.

5. The substrate conveying robot according to claim 1, wherein the substrate receiving operation is executed by an upper blade member of the one blade member and the other blade member.

6. The substrate conveying robot according to claim 1, wherein the controller makes both the one blade member and the other blade member into a substrate non-holding state and elevates the blade member on a lower side by the blade elevating unit prior to the substrate receiving operation and the substrate placing operation so as to make the robot arm and the substrate holding device execute a lowermost stage substrate receiving operation of receiving a substrate placed on a lowermost stage of the substrate placing structure.

7. The substrate conveying robot according to claim 1, further comprising an additional blade elevating unit configured to move the other blade member in the vertical direction with respect to the one blade member.

8. The substrate conveying robot according to claim 7, wherein the blade elevating unit and the additional blade elevating unit are configured to drive the one blade member and the other blade member to be elevated independently with each other.

9. The substrate conveying robot according to claim 7,
wherein the blade elevating unit and the additional blade elevating unit have a pair of fluid pressure cylinders configured to drive respectively the one blade member and the other blade member to be elevated,
wherein the fluid pressure cylinder for the blade member on an upper side is arranged so that its piston faces downward, and
wherein the fluid pressure cylinder for the blade member on a lower side is arranged so that its piston faces upward.

10. The substrate conveying robot according to claim 1, wherein each of the plurality of hands has a plurality of blade members whose vertical interval is fixed mutually.

11. A substrate processing system, comprising:
a substrate conveying robot according to claim 1; and
a plurality of different kinds of the substrate placing structures,
wherein substrate placing pitches in the substrate placing structures are identical with each other.

12. The substrate conveying robot according to claim 1, further comprising a substrate detection unit having a substrate sensor provided on a distal end portion of the blade member which is not driven by the blade elevating unit to be elevated.

13. The substrate conveying robot according to claim 1, further comprising a substrate detection unit having a substrate sensor provided on a distal end portion of the blade member which is driven by the blade elevating unit to be elevated.

14. A substrate conveying robot for holding and conveying a substrate, comprising:
a robot arm;
a substrate holding device mounted on the robot arm; and
a controller configured to control the robot arm and the substrate holding device,
wherein the substrate holding device has a plurality of hands, one of the hands having one blade member configured to hold one substrate, an other of the hands having an other blade member configured to hold an other substrate, the one blade member and the other blade member being arranged in a vertical direction,
wherein the substrate holding device further has a blade elevating unit disposed inside the one of the hands and configured to move only the one blade member in the vertical direction with respect to the other blade member,
wherein the controller is configured to make the robot arm and the substrate holding device execute, in a state that one of the one blade member and the other blade member is made into a substrate holding state and an other of the one blade member and the other blade member is made into a substrate non-holding state, a blade member advancing operation of advancing the one blade member and the other blade member into a substrate placing structure having an upper stage and a lower stage, a substrate receiving operation of receiving a substrate placed on one of the upper stage and the lower stage by the blade member in the substrate non-holding state, and a substrate placing operation of placing the substrate of the blade member in the substrate holding state on an other of the upper stage and the lower stage, and
wherein the plurality of hands have a common rotational axis and are configured to be independently rotated about the common rotational axis relative to each other.

15. The substrate conveying robot according to claim 14, further comprising a substrate detection unit having a substrate sensor provided on a distal end portion of the blade member which is driven by the blade elevating unit to be elevated.

16. The substrate conveying robot according to claim 14, wherein each of the plurality of hands has a plurality of blade members whose vertical interval is fixed mutually.

17. A substrate processing system, comprising:
a substrate conveying robot according to claim 14; and
a plurality of different kinds of the substrate placing structures,
wherein substrate placing pitches in the substrate placing structures are identical with each other.

18. The substrate conveying robot according to claim 14, wherein the controller makes the substrate holding device into the second working state prior to the blade member advancing operation, the substrate receiving operation, and the substrate placing operation, and advances one of the one blade member and the other blade member below a substrate placed on a lowermost stage of the substrate placing structure and elevates the one of the one blade member and the other blade member so as to make the robot arm and the substrate holding device execute a lowermost stage substrate receiving operation of receiving the substrate placed on the lowermost stage.

19. The substrate conveying robot according to claim 14, wherein a vertical interval of the one blade member and the other blade member is configured to be made into 12 mm or less by the blade elevating unit.

20. The substrate conveying robot according to claim 14, further comprising a Z-axis elevating unit having a servo motor capable of simultaneously elevating the plurality of hands, wherein the substrate receiving operation is executed by using the Z-axis elevating unit.

21. The substrate conveying robot according to claim 14, wherein the substrate receiving operation is executed by an upper blade member of the one blade member and the other blade member.

22. The substrate conveying robot according to claim 14, wherein the controller makes both the one blade member and the other blade member into a substrate non-holding state and elevates the blade member on a lower side by the blade elevating unit prior to the substrate receiving operation and the substrate placing operation so as to make the robot arm and the substrate holding device execute a lowermost stage substrate receiving operation of receiving a substrate placed on a lowermost stage of the substrate placing structure.

23. The substrate conveying robot according to claim 14, further comprising an additional blade elevating unit configured to move the other blade member in the vertical direction with respect to the one blade member.

24. The substrate conveying robot according to claim 23, wherein the blade elevating unit and the additional blade elevating unit are configured to drive the one blade member and the other blade member to be elevated independently with each other.

25. The substrate conveying robot according to claim 23,
wherein the blade elevating unit and the additional blade elevating unit have a pair of fluid pressure cylinders configured to drive respectively the one blade member and the other blade member to be elevated, wherein the fluid pressure cylinder for the blade member on an upper side is arranged so that its piston faces downward, and wherein the fluid pressure cylinder for the blade member on a lower side is arranged so that its piston faces upward.

26. The substrate conveying robot according to claim 14, further comprising a substrate detection unit having a substrate sensor provided on a distal end portion of the blade member which is not driven by the blade elevating unit to be elevated.

* * * * *